US012336359B2

(12) United States Patent
Cho et al.

(10) Patent No.: US 12,336,359 B2
(45) Date of Patent: Jun. 17, 2025

(54) DISPLAY DEVICE

(71) Applicant: SAMSUNG DISPLAY CO., LTD., Yongin-si (KR)

(72) Inventors: Joo Woan Cho, Seongnam-si (KR); Dae Ho Song, Hwaseong-si (KR); Tae Hee Lee, Hwaseong-si (KR); Hyung Il Jeon, Seoul (KR); Byeong Hwa Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/745,970

(22) Filed: Jun. 17, 2024

(65) Prior Publication Data

US 2024/0339489 A1    Oct. 10, 2024

Related U.S. Application Data

(63) Continuation of application No. 17/570,112, filed on Jan. 6, 2022, now Pat. No. 12,015,048.

(30) Foreign Application Priority Data

Apr. 30, 2021    (KR) ........................ 10-2021-0056582

(51) Int. Cl.
*H01L 23/00* (2006.01)
*H01L 23/48* (2006.01)
(Continued)

(52) U.S. Cl.
CPC ......... *H10H 29/142* (2025.01); *H01L 23/481* (2013.01); *H01L 24/06* (2013.01);
(Continued)

(58) Field of Classification Search
CPC ..... H01L 27/156; H01L 23/481; H01L 24/06; H01L 25/18; H01L 24/05; H01L 24/08;
(Continued)

(56) References Cited

U.S. PATENT DOCUMENTS 8,766,312 B2    7/2014    Sekine et al.
11,271,054 B2   3/2022    Lee et al.
(Continued)

FOREIGN PATENT DOCUMENTS

CN    1350704 A     5/2002
EP    2445006 B1    7/2015
(Continued)

OTHER PUBLICATIONS

Notice of Allowance dated Jan. 30, 2025 regarding Korean Patent Application No. 10-2021-0056582 (2 pages).

*Primary Examiner* — Elias Ullah
(74) *Attorney, Agent, or Firm* — Womble Bond Dickinson (US) LLP

(57) ABSTRACT

A display device includes a first substrate including a display area, a non-display area, and a plurality of pixel circuit units in the display area and the non-display area, a plurality of light emitting elements on the first substrate in the display area, the plurality of light emitting elements being electrically connected to the pixel circuit units, a hole mask layer on the first substrate and including a plurality of holes corresponding to the light emitting elements, a second substrate on the hole mask layer and including a plurality of open holes corresponding to the plurality of holes, and a plurality of light exit patterns in the plurality of the open holes of the second substrate corresponding to the plurality of holes, wherein each of the light exit patterns includes a first part in one of the plurality of open holes.

20 Claims, 38 Drawing Sheets

(51) Int. Cl.
*H01L 25/18* (2023.01)
*H10H 29/14* (2025.01)
*H10D 84/80* (2025.01)

(52) U.S. Cl.
CPC .............. *H01L 25/18* (2013.01); *H01L 24/05* (2013.01); *H01L 24/08* (2013.01); *H01L 24/16* (2013.01); *H01L 24/48* (2013.01); *H01L 2224/05025* (2013.01); *H01L 2224/05541* (2013.01); *H01L 2224/0613* (2013.01); *H01L 2224/06181* (2013.01); *H01L 2224/08225* (2013.01); *H01L 2224/16145* (2013.01); *H01L 2224/48229* (2013.01); *H10D 84/80* (2025.01)

(58) Field of Classification Search
CPC ....... H01L 24/16; H01L 24/48; H01L 27/105; H01L 2224/05025; H01L 2224/05541; H01L 2224/0613; H01L 2224/06181; H01L 2224/08225; H01L 2224/16145; H01L 2224/48229; H01L 33/502; H01L 33/58; H01L 33/62; H01L 33/60; H01L 25/0753; H01L 33/50; G09G 3/3225; G09G 3/3233; G09G 3/3241; G09G 3/3258; G09G 2300/0439; G09G 2320/0242; G06F 3/147; G02B 5/201
See application file for complete search history.

(56) References Cited

U.S. PATENT DOCUMENTS

| | | |
|---|---|---|
| 2016/0013170 A1 | 1/2016 | Sakariya et al. |
| 2017/0309698 A1 | 10/2017 | Bower et al. |

FOREIGN PATENT DOCUMENTS

| | | |
|---|---|---|
| KR | 10-1608868 B1 | 4/2016 |
| KR | 10-2018-0118488 A | 10/2018 |
| KR | 10-1973855 B1 | 8/2019 |
| KR | 10-2021-0006567 A | 1/2021 |
| KR | 102571125 B1 | 8/2023 |
| KR | 102604051 B1 | 11/2023 |

DISPLAY DEVICE

CROSS-REFERENCE TO RELATED APPLICATIONS

This application is a continuation of U.S. patent application Ser. No. 17/570,112, filed Jan. 6, 2022, now U.S. Pat. No. 12,015,048, which claims priority to and the benefit of Korean Patent Application No. 10-2021-0056582, filed Apr. 30, 2021, the entire content of both of which is incorporated herein by reference.

BACKGROUND

1. Field

The present disclosure relates to a display device.

2. Description of the Related Art

As the information society develops, demands for display devices for displaying images are increasing in various forms. The display devices may be flat panel displays such as liquid crystal displays, field emission displays, and light emitting displays. The light emitting displays may include an organic light emitting display including an organic light emitting diode (OLED) element as a light emitting element and an inorganic light emitting display including an inorganic semiconductor element as a light emitting element.

Recently, a head-mounted display including a light emitting display has been developed. The head-mounted display is a virtual reality (VR) or augmented reality (AR) glasses-type monitor device that is worn by a user in the form of glasses or a helmet and forms a focus at a short distance in front of the eyes.

SUMMARY

Aspects and features of embodiments of the present disclosure provide an ultra-high resolution display device that includes inorganic light emitting elements and also includes a large number of light emitting elements per unit area.

Aspects and features of embodiments of the present disclosure also provide a display device that includes light exit structures to prevent color mixing of light emitted from adjacent emission areas.

However, aspects and features of embodiments of the present disclosure are not limited to the one set forth herein. The above and other aspects and features of embodiments of the present disclosure will become more apparent to one of ordinary skill in the art to which the present disclosure pertains by referencing the detailed description of the present disclosure given below.

According to one or more embodiments of the present disclosure, a display device includes a first substrate including a display area, and a non-display area, and a plurality of pixel circuit units in the display area and the non-display area, a plurality of light emitting elements on the first substrate in the display area, the plurality of light emitting elements being electrically connected to the pixel circuit units, a hole mask layer on the first substrate and including a plurality of holes corresponding to the light emitting elements, a second substrate on the hole mask layer and including a plurality of open holes corresponding to the plurality of holes, and a plurality of light exit patterns in the plurality of open holes of the second substrate corresponding to the plurality of holes, wherein each of the light exit patterns includes a first part in one of the plurality of open holes and a second part protruding from an upper surface of the second substrate, wherein a refractive index of each of the light exit patterns is greater than a refractive index of the second substrate.

A maximum diameter of the second part may be greater than a diameter of the plurality of holes, wherein side surfaces of the first part that are in contact with the second substrate are inclined.

The second part may have a curved outer surface.

A refractive index of the second part may be greater than a refractive index of the first part.

The plurality of holes and the plurality of light exit patterns may overlap the plurality of light emitting elements in a thickness direction of the display device.

The light emitting elements may emit light of a first color, wherein at least some of the light exit patterns may include a colorant to block transmission of the light of the first color.

The first part of each of the plurality of light exit patterns may include wavelength conversion particles to convert a wavelength of the light of a first color emitted from the light emitting elements, wherein the second part of each of at least some of the plurality of light exit patterns may include a colorant to block transmission of the light of the first color.

The display device may further include a third substrate between the hole mask layer and the first substrate, and a plurality of color control structures between the third substrate and the light emitting elements, wherein the plurality of color control structures may overlap the light emitting elements in a thickness direction of the display device.

The display device may further include a plurality of color filters between the third substrate and the color control structures, wherein a width of the color filters may be greater than a diameter of the holes.

The display device may further include a capping layer on the second substrate, wherein a refractive index of the capping layer may be smaller than the refractive index of the first part.

The refractive index of the capping layer may be the same as the refractive index of the second substrate.

A thickness of the capping layer may be equal to or smaller than a thickness of the second part.

Each of the plurality of light emitting elements may include a first semiconductor layer, an active layer on the first semiconductor layer, and a second semiconductor layer on the active layer, and the display device may further include a third semiconductor layer on the first substrate and on a surface of which the second semiconductor layer of each of the light emitting elements is located.

The second semiconductor layers of the light emitting elements may be connected to each other through a base layer on the surface of the third semiconductor layer in the display area and the non-display area, and wherein the display device may include a plurality of first connection electrodes respectively located between the light emitting elements and the first substrate in the display area, and a plurality of second connection electrodes located between the first substrate and the base layer in the non-display area.

The first substrate may include a plurality of pixel electrodes in the display area and a plurality of common electrodes in the non-display area, and the plurality of light emitting elements may be on the pixel electrodes, and the second connection electrodes may be on the common electrodes.

According to one or more embodiments of the present disclosure, a display device includes a first substrate including a display area and a non-display area around the display area, a plurality of light emitting elements spaced from each other in a first direction and a second direction in the display area of the first substrate, a plurality of common electrodes in the non-display area of the first substrate, and being around the display area, a hole mask layer on the first substrate and includes a plurality of holes corresponding to respective ones of the light emitting elements and spaced from each other in the first direction and the second direction, a second substrate on the hole mask layer and includes a plurality of open holes formed to correspond to the plurality of holes, and a plurality of light exit patterns in the open holes and are spaced from each other in the first direction and the second direction, wherein the light exit patterns include a material having a greater refractive index than the second substrate.

A maximum diameter of the light exit patterns may be greater than a diameter of the plurality of holes.

The display device may further include a plurality of color control structures between the first substrate and the second substrate, the plurality of color control structures corresponding to respective ones of the light emitting elements, and a plurality of color filters corresponding to the color control structures, wherein the color filters may overlap the plurality of holes.

A diameter of the color filters may be greater than the diameter of the plurality of holes.

The display device may further include a bank layer around the color filters and extending in the first direction and the second direction.

BRIEF DESCRIPTION OF THE DRAWINGS

These and/or other aspects and features of embodiments of the present disclosure will become apparent and more readily appreciated from the following description of the embodiments, taken in conjunction with the accompanying drawings in which.

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings and scope of the present disclosure. Similarly, the second element could also be termed the first element.

Hereinafter, embodiments will be described with reference to the accompanying drawings.

Figure 1:
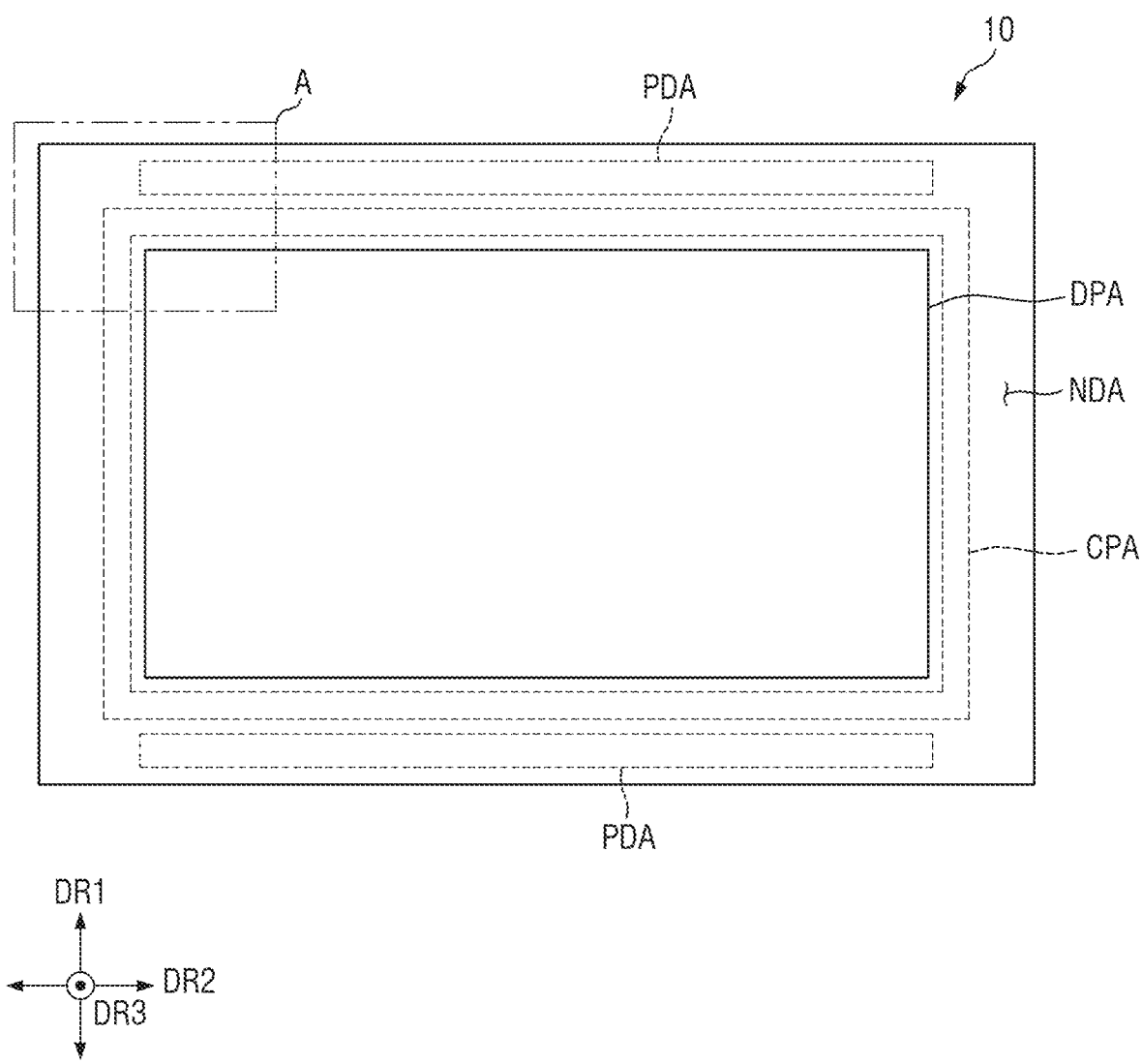
FIG. 1 is a schematic plan view of a display device according to one or more embodiments.

FIG. 1 is a schematic plan view of a display device 10 according to one or more embodiments.

Referring to FIG. 1, the display device 10 displays moving images or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head-mounted displays, mobile communication terminals, electronic notebooks, electronic books, portable multimedia players (PMPs), navigation devices, game machines, digital cameras and camcorders, all of which provide a display screen.

The display device 10 includes a display panel that provides a display screen. Examples of the display panel may include inorganic light emitting diode display panels, organic light emitting display panels, quantum dot light emitting display panels, plasma display panels, and field emission display panels. A display panel in which inorganic light emitting diodes are disposed on a semiconductor circuit board will be described below as an example of the display panel, but the present disclosure is not limited to this case, and other display panels can also be applied as long as the same technical spirit is applicable.

The shape of the display device 10 can be variously modified. For example, the display device 10 may have various shapes such as a horizontally long rectangle, a vertically long rectangle, a square, a quadrangle with rounded corners (vertices), other polygons, and a circle. The shape of a display area DPA of the display device 10 may also be similar to the overall shape of the display device 10. In FIG. 1, the display device 10 shaped like a rectangle that is long in a second direction DR2 is illustrated.

The display device 10 may include the display area DPA and a non-display area NDA. The display area DPA may be an area where an image can be displayed, and the non-display area NDA may be an area where no image is displayed. The display area DPA may also be referred to as an active area, and the non-display area NDA may also be referred to as an inactive area. The display area DPA may generally occupy the center (or the central region) of the display device 10.

The non-display area NDA may be disposed around the display area DPA along the edge or periphery of the display area DPA. The non-display area NDA may entirely or partially surround the display area DPA. The display area DPA may be rectangular, and the non-display area NDA may be disposed adjacent to four sides of the display area DPA along the edge or periphery pf the display area DPA. The non-display area NDA may form a bezel of the display device 10. In each non-display area NDA, wirings or circuit drivers included in the display device 10 may be disposed, or external devices may be mounted.

For example, the non-display area NDA may include a plurality of pad areas PDA and a common electrode connection part CPA. The common electrode connection part CPA may be around (e.g., surround) the display area DPA, and the pad areas PDA may be disposed on a side of the common electrode connection part CPA to extend in a direction (e.g., the second direction DR2). A plurality of pads PD (see FIG. 2) electrically connected to an external device are disposed in the pad areas PDA, and common electrodes CE (see FIG. 2) electrically connected to a plurality of light emitting elements ED (see FIG. 3) disposed in the display area DPA are disposed in the common electrode connection part CPA. In the drawing, the pad areas PDA are disposed outside the common electrode connection part CPA of the non-display area NDA and disposed on both sides of the display area DPA in a first direction DR1. However, the present disclosure is not limited thereto, and a larger or smaller number of pad areas PDA may be disposed. In addition, in one or more embodiments, the display device 10 may further include a pad area PDA disposed in an inner non-display area inside the common electrode connection part CPA of the non-display area NDA.

Figure 2:
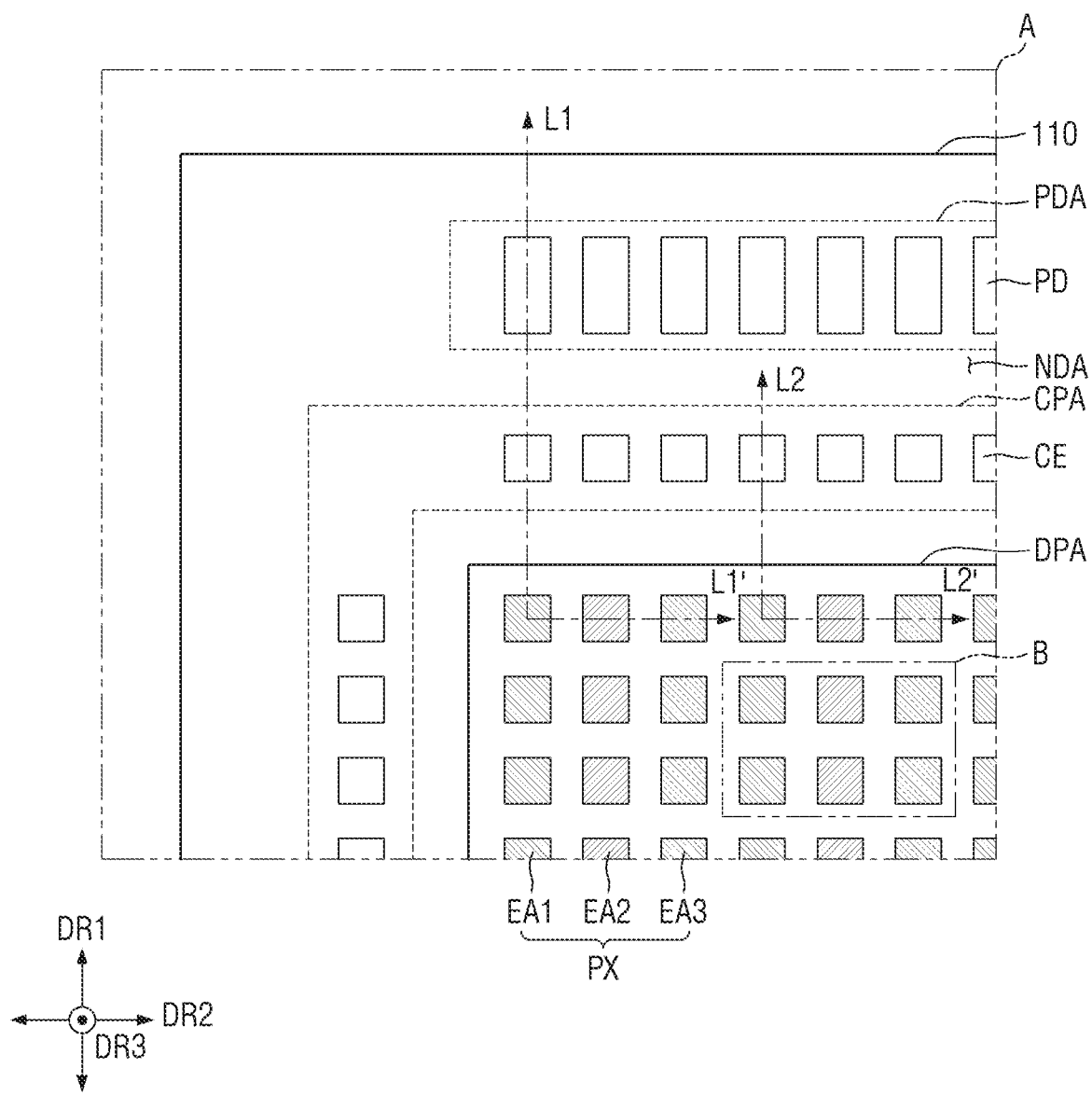
FIG. 2 is a plan view of a part A of FIG. 1.
Figure 3:
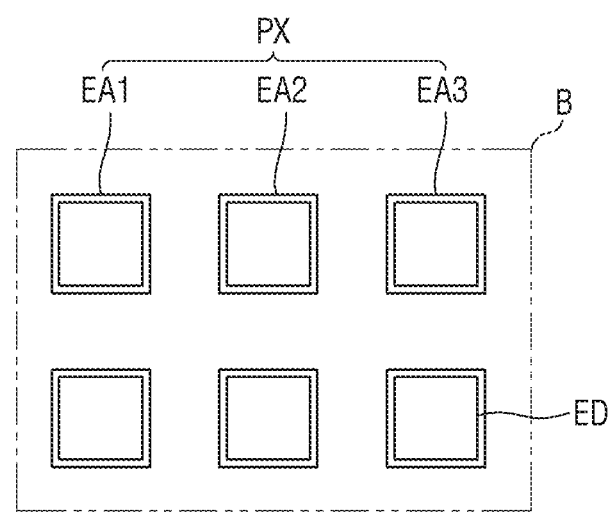
FIG. 3 is a plan view of a part B of FIG. 2.
Figure 3:
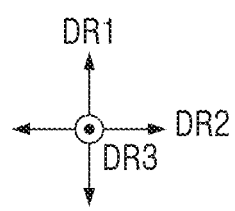

FIG. 2 is a plan view of a part A of FIG. 1. FIG. 3 is a plan view of a part B of FIG. 2. FIG. 2 is a partial enlarged view of the display area DPA, a pad area PDA, and the common electrode connection part CPA of the display device 10, and FIG. 3 illustrates the planar arrangement of some pixels PX in the display area DPA.

Referring to FIGS. 2 and 3, the display area DPA of the display device 10 may include a plurality of pixels PX. The pixels PX may be arranged in a matrix direction. For example, the pixels PX may be arranged along rows and columns of a matrix. Each of the pixels PX may be rectangular or square in a plan view. However, the present disclosure is not limited thereto, and each of the pixels PX may also have a rhombus shape having each side inclined with respect to a direction. The pixels PX may be arranged in a stripe type or an island type. In addition, each of the pixels PX may display a specific color by including one or more light emitting elements that emit light of a specific wavelength band.

Each of the pixels PX may include a plurality of emission areas EA1 through EA3, and in the display device 10, one pixel PX composed of a plurality of emission areas EA1 through EA3 may have a minimum emission unit.

For example, one pixel PX may include a first emission area EA1, a second emission area EA2, and a third emission area EA3. The first emission area EA1 may emit light of a first color, the second emission area EA2 may emit light of a second color, and the third emission area EA3 may emit light of a third color. For example, the first color may be red, the second color may be green, and the third color may be blue. However, the present disclosure is not limited thereto, and the emission areas EA1 through EA3 may also emit light of the same color. In one or more embodiments, one pixel PX may include three emission areas EA1 through EA3, but the present disclosure is not limited thereto. For example, one pixel PX may also include four or more emission areas.

Each of the emission areas EA1 through EA3 may include a light emitting element ED emitting light of a specific color. Although a case where the light emitting element ED has a quadrangular planar shape is described as an example, embodiments of the present disclosure are not limited thereto. For example, the light emitting element ED may also have a polygonal, circular, oval, or irregular shape other than the quadrangular shape.

The emission areas EA1 through EA3 may be arranged along the first direction DR1 and the second direction DR2, and the first emission area EA1, the second emission area EA2, and the third emission area EA3 may be alternately arranged along the first direction DR1. As a plurality of pixels PX are arranged along the first direction DR1 and the second direction DR2, the first emission area EA1, the second emission area EA2, and the third emission area EA3 may be sequentially arranged along the first direction DR1, and this arrangement may be repeated. In addition, each of the first emission area EA1, the second emission area EA2, and the third emission area EA3 may be repeatedly arranged along the second direction DR2.

The display device 10 may include a bank layer BNL around (e.g. surrounding) the emission areas EA1 through EA3, and the bank layer BNL (e.g., see, FIG. 4) may separate different emission areas EA1 through EA3 from each other. The bank layer BNL may be spaced from the light emitting elements ED and may be around (e.g., surround) the light emitting elements ED in a plan view. The bank layer BNL may include parts extending in the first direction DR1 and the second direction DR2 to form a mesh, net, or lattice-shaped pattern in a plan view.

Although each of the emission areas EA1 through EA3 surrounded by the bank layer BNL has a quadrangular planar shape in FIGS. 2 and 3, the present disclosure is not limited thereto. The planar shape of each of the emission areas EA1 through EA3 may be changed variously according to the planar arrangement of the bank layer BNL.

A plurality of common electrodes CE may be disposed in the common electrode connection part CPA of the non-display area NDA. The common electrodes CE may be spaced from each other and may be around (e.g., surround) the display area DPA. The common electrodes CE may be electrically connected to the light emitting elements ED disposed in the display area DPA. In addition, the common electrodes CE may be electrically connected to a semiconductor circuit board.

In the drawings, the common electrode connection part CPA is around (e.g. surrounds) both sides of the display area DPA in the first direction DR1 and the second direction DR2. However, the present disclosure is not limited thereto. The planar arrangement of the common electrode connection part CPA may vary according to the arrangement of the common electrodes CE. For example, when the common electrodes CE are arranged along a direction on a side of the display area DPA, the common electrode connection part CPA may extend in the direction in a plan view.

A plurality of pads PD may be disposed in the pad area PDA. Each of the pads PD may be electrically connected to a circuit board pad PDC (see FIG. 4) disposed on an external circuit board CB (see FIG. 4). The pads PD may be spaced from each other in the second direction DR2 in the pad area PDA.

The arrangement of the pads PD may be designed according to the number of light emitting elements ED disposed in the display area DPA and the arrangement of wirings electrically connected to the light emitting elements ED. The arrangement of different pads PD may be variously changed according to the arrangement of the light emitting elements ED and the arrangement of the wirings electrically connected to the light emitting elements ED.

Figure 4:
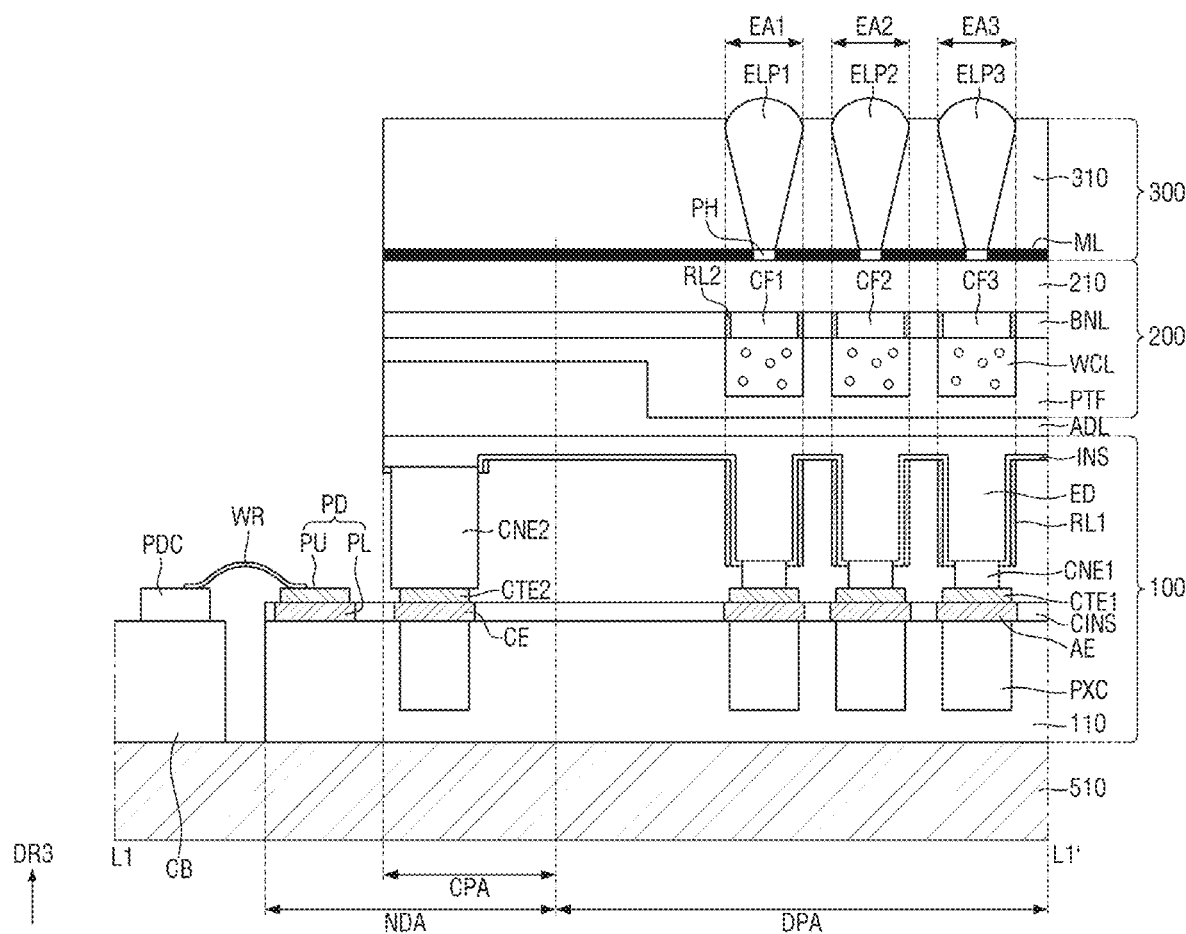
FIG. 4 is a cross-sectional view taken along the line L1-L1' of FIG. 2.
Figure 5:
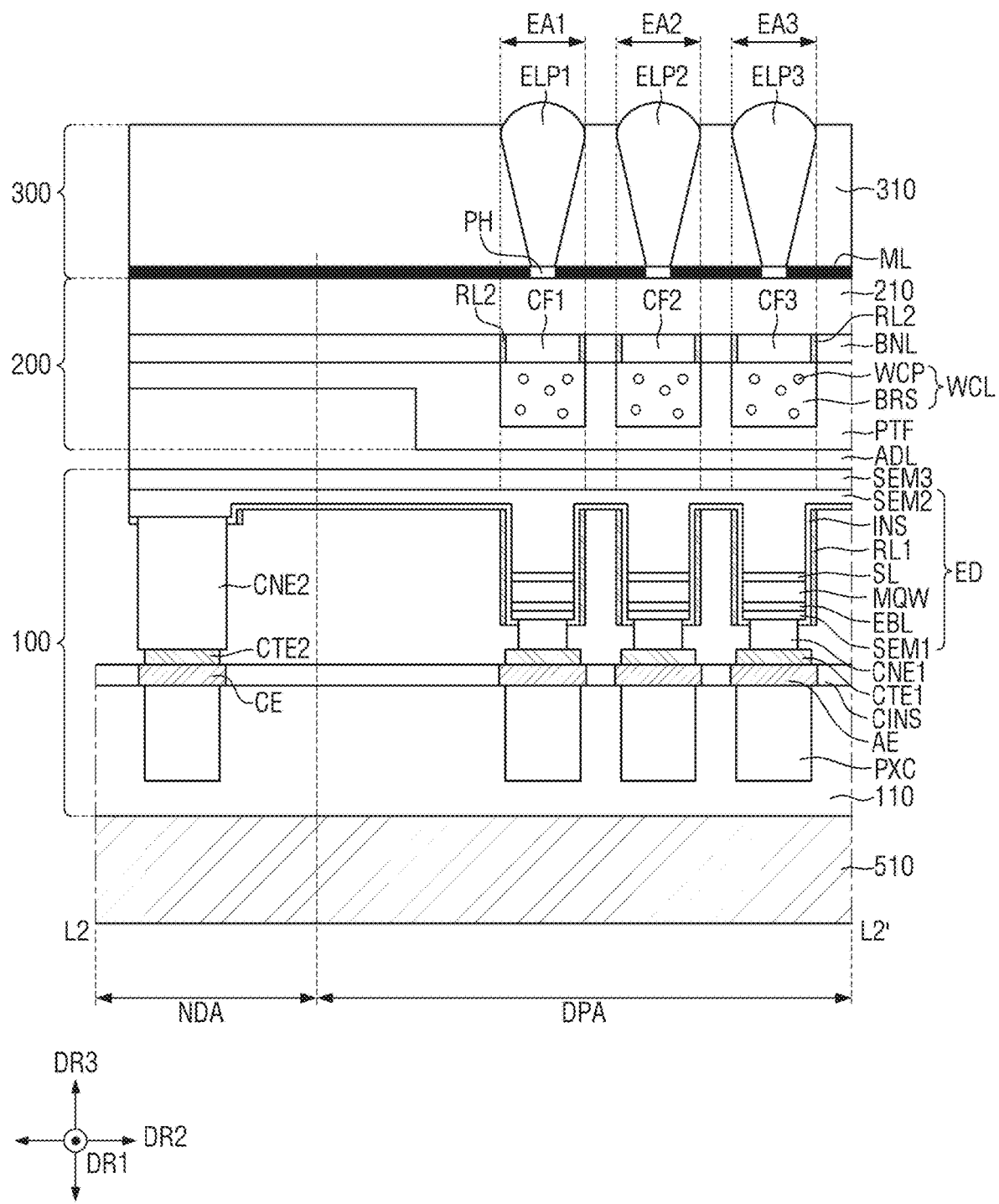
FIG. 5 is a cross-sectional view taken along the line L2-L2' of FIG. 2.
Figure 6:
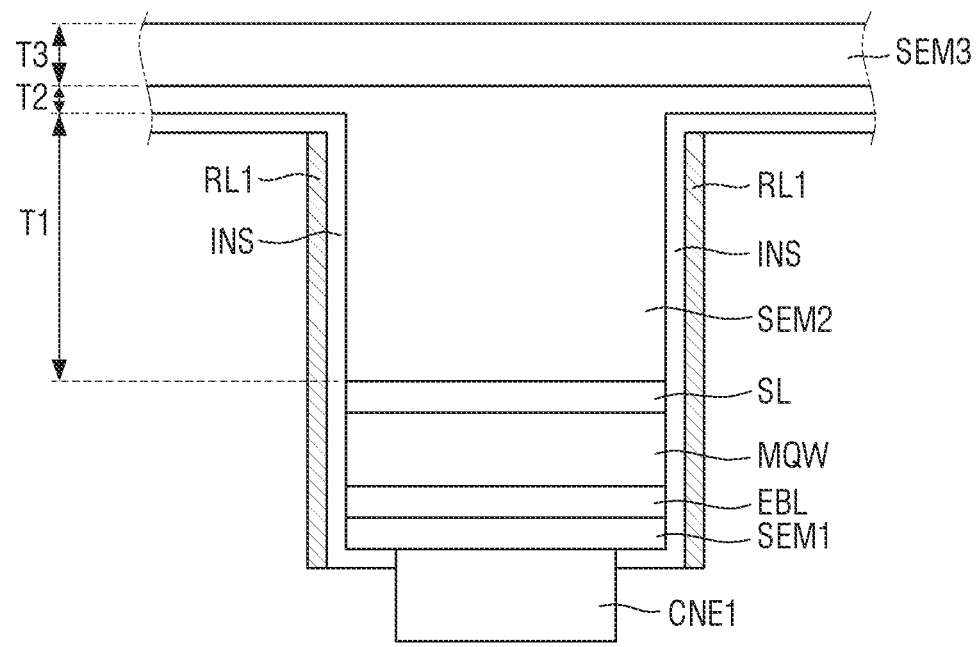
FIG. 6 is a cross-sectional view of a light emitting element according to one or more embodiments.
Figure 7:
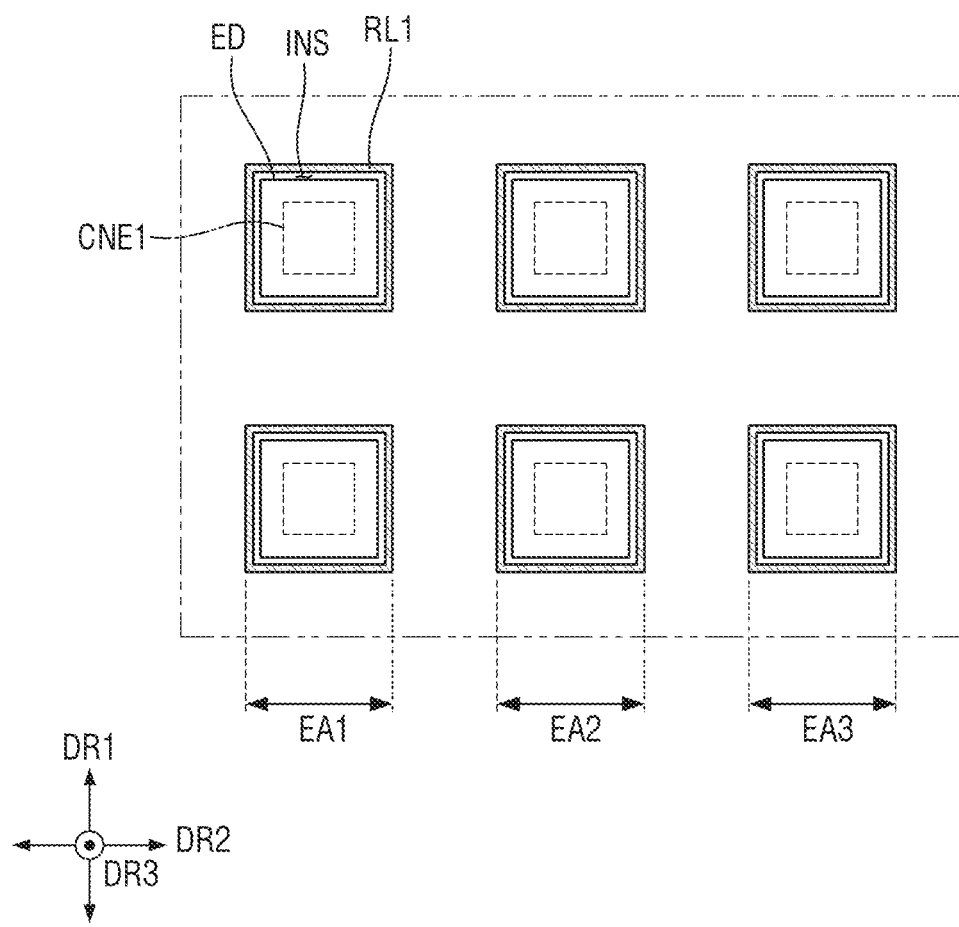
FIG. 7 is a plan view illustrating an arrangement of light emitting elements of a display device according to one or more embodiments.
Figure 8:
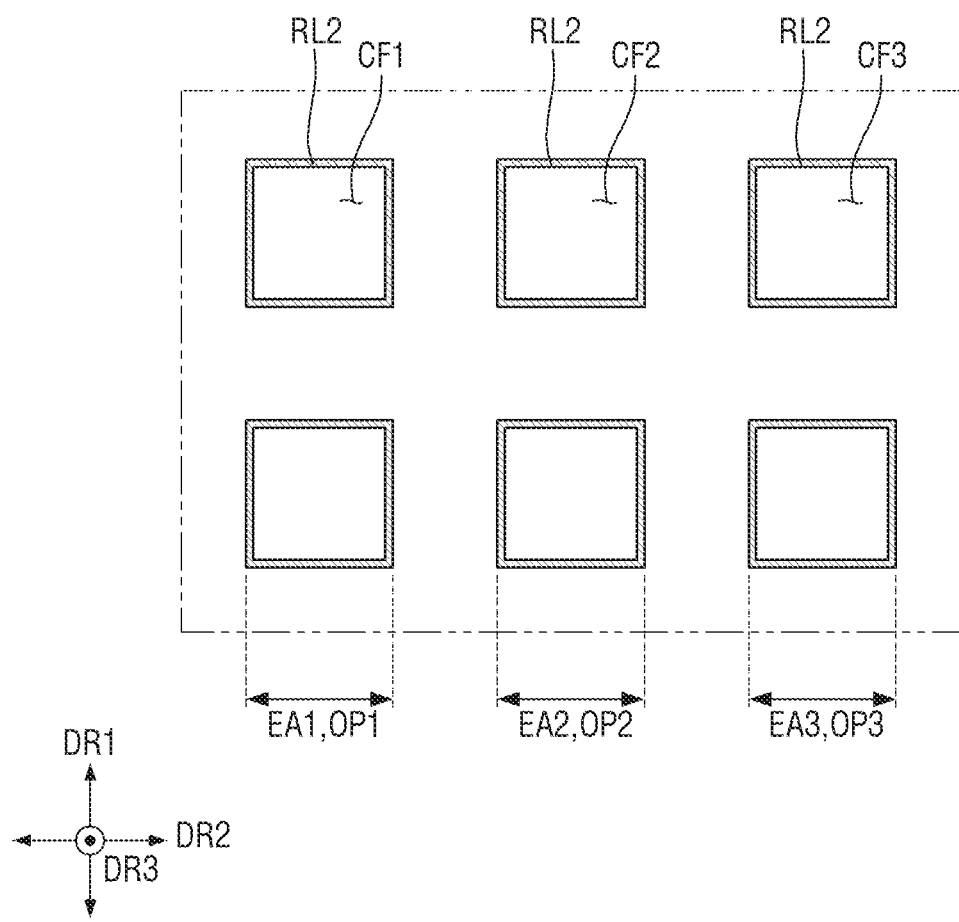
FIG. 8 is a plan view illustrating an arrangement of color filters of a display device according to one or more embodiments.
Figure 9:
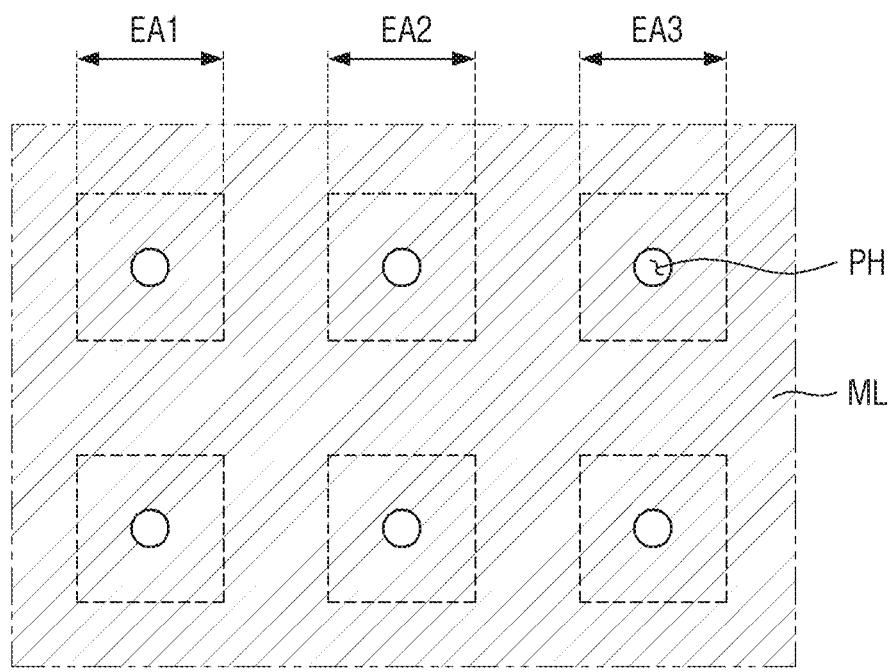
FIG. 9 is a plan view illustrating an arrangement of a plurality of holes formed in a hole mask layer of a display device according to one or more embodiments.
Figure 10:
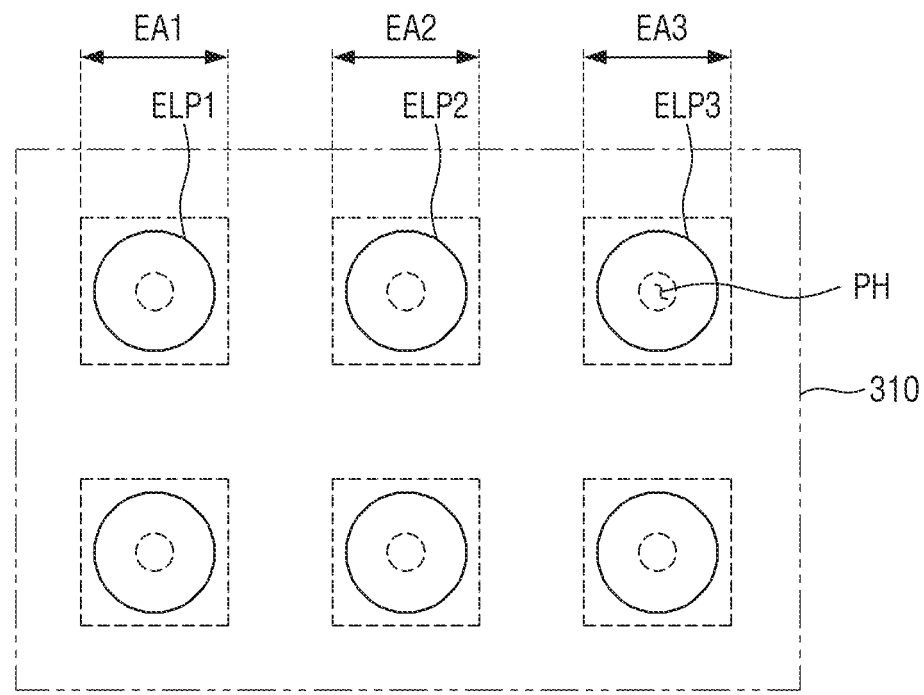
FIG. 10 is a plan view illustrating an arrangement of light exit patterns of a display device according to one or more embodiments.
Figure 10:
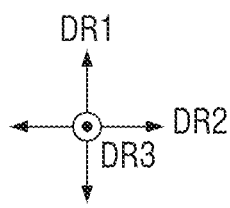

FIG. 4 is a cross-sectional view taken along the line L1-L1' of FIG. 2. FIG. 5 is a cross-sectional view taken along the line L2-L2' of FIG. 2. FIG. 6 is a cross-sectional view of a light emitting element ED according to one or more embodiments. FIG. 7 is a plan view illustrating an arrangement of the light emitting elements ED of the display device 10 according to one or more embodiments. FIG. 8 is a plan view illustrating an arrangement of color filters CF1 through CF3 of the display device 10 according to one or more embodiments. FIG. 9 is a plan view illustrating an arrangement of a plurality of holes PH formed in a hole mask layer ML of the display device 10 according to one or more embodiments. FIG. 10 is a plan view illustrating an arrangement of light exit patterns ELP1 through ELP3 of the display device 10 according to one or more embodiments. FIG. 4 illustrates a cross section across the pad area PDA, the common electrode connection part CPA, and a pixel PX of the display area DPA. FIG. 5 illustrates a cross section across the common electrode connection part CPA and the light emitting elements ED of a pixel PX. FIGS. 7-9 schematically illustrate the planar arrangement of a display substrate 100, a color conversion substrate 200, and a light exit substrate 300.

Referring to FIGS. 4-9 in conjunction with FIGS. 1-3, the display device 10 according to one or more embodiments may include the display substrate 100, the color conversion substrate 200, the light exit substrate 300, and a circuit board CB. In addition, the display device 10 may further include a heat dissipation substrate 510 disposed under the display substrate 100.

The display substrate 100 may include at least a first substrate 110 and a plurality of light emitting elements ED, a plurality of pads PD, and a plurality of electrode connection parts CTE1 and CTE2 disposed on the first substrate 110. The color conversion substrate 200 may include at least a second substrate 210 and the color filters CF1 through CF3 and color control structures WCL disposed on the second substrate 210. The light exit substrate 300 may include a third substrate 310, a plurality of light exit patterns ELP1 through ELP3 disposed in the third substrate 310, and the hole mask layer ML. The circuit board CB may be disposed on the heat dissipation substrate 510 and spaced from the first substrate 110 and may include circuit board pads PDC that are electrically connected to the pads PD of the display substrate 100.

The first substrate 110 may be a semiconductor circuit board. The first substrate 110 may be a silicon wafer substrate formed using a semiconductor process and may include a plurality of pixel circuit units PXC. Each of the pixel circuit units PXC may be formed through a process of forming a semiconductor circuit on a silicon wafer. Each of the pixel circuit units PXC may include at least one transistor and at least one capacitor formed using a semiconductor process. For example, the pixel circuit units PXC may include complementary metal oxide semiconductor (CMOS) circuits.

The pixel circuit units PXC may be disposed in the display area DPA and the non-display area NDA. Among the pixel circuit units PXC, pixel circuit units PXC disposed in the display area DPA may be electrically connected to pixel electrodes AE, respectively. The pixel circuit units PXC disposed in the display area DPA may be disposed to correspond to the pixel electrodes AE and may respectively overlap the light emitting elements ED disposed in the display area DPA in a third direction DR3 which is a thickness direction of the display device 10.

The pixel circuit units PXC that are disposed in the non-display area NDA may be electrically connected to the common electrodes CE, respectively. The pixel circuit units PXC disposed in the non-display area NDA may be disposed to correspond to the common electrodes CE and may respectively overlap the common electrodes CE and second connection electrodes CNE2 disposed in the non-display area NDA in the third direction DR3.

A circuit insulating layer CINS may be disposed on the pixel circuit units PXC. The circuit insulating layer CINS may protect the pixel circuit units PXC and planarize steps of the pixel circuit units PXC. The circuit insulating layer CINS may expose a part of each of the pixel electrodes AE so that the pixel electrodes AE are electrically connected to first connection electrodes CNE1. The circuit insulating layer CINS may include an inorganic insulating material such as silicon oxide ($SiO_x$), silicon nitride ($SiN_x$), silicon oxynitride ($SiO_xN_y$), aluminum oxide ($AlO_x$), or aluminum nitride ($AlN_x$).

The pixel electrodes AE may be disposed in the display area DPA and may be disposed on corresponding pixel circuit units PXC. Each of the pixel electrodes AE may be an exposed electrode that is integrally formed with a pixel circuit unit PXC and exposed from the pixel circuit unit PXC. The common electrodes CE may be disposed in the common electrode connection part CPA of the non-display area NDA and may be disposed on corresponding pixel circuit units PXC. Each of the common electrodes CE may be an exposed electrode that is integrally formed with a pixel circuit unit PXC and exposed from the pixel circuit unit PXC. The pixel electrodes AE and the common electrodes CE may each include a metal material such as aluminum (Al).

Each of the electrode connection parts CTE1 and CTE2 may be disposed on a pixel electrode AE or a common electrode CE. First electrode connection parts CTE1 may be disposed in the display area DPA and disposed on the pixel electrodes AE, respectively. The first electrode connection parts CTE1 may correspond to different pixel electrodes AE. Second electrode connection parts CTE2 may be disposed in the common electrode connection part CPA of the non-display area NDA to be around (e.g., surround) the display area DPA and may be disposed on the common electrodes CE, respectively.

In an example, each of the electrode connection parts CTE1 and CTE2 may be directly disposed on a pixel electrode AE or a common electrode CE to contact the pixel electrode AE or the common electrode CE. Each of the electrode connection parts CTE1 and CTE2 may be electrically connected to a pixel electrode AE or a common electrode CE and a light emitting element ED. In addition, each of the second electrode connection parts CTE2 may be electrically connected to any one of the pads PD through a pixel circuit unit PXC formed in the non-display area NDA.

Each of the electrode connection parts CTE1 and CTE2 may include a material that may be electrically connected to a pixel electrode AE or a common electrode CE and a light emitting element ED. For example, each of the electrode connection parts CTE1 and CTE2 may include at least any one of gold (Au), copper (Cu), aluminum (Al), and tin (Sn). Alternatively, each of the electrode connection parts CTE1 and CTE2 may include a first layer including any one of gold (Au), copper (Cu), aluminum (Al) and tin (Sn) and a second layer including another one of gold (Au), copper (Cu), aluminum (Al) and tin (Sn).

The pads PD are disposed in the pad area PDA of the non-display area NDA. The pads PD are spaced from the common electrodes CE and the second electrode connection parts CTE2. The pads PD may be spaced from the common electrodes CE toward the outside of the non-display area NDA.

Each of the pads PD may include a pad base layer PL and a pad upper layer PU. The pad base layer PL may be disposed on the first substrate 110, and the circuit insulating layer CINS may expose the pad base layer PL. The pad upper layer PU may be directly disposed on the pad base layer PL.

The pads PD may be electrically connected to the circuit board pads PDC of the circuit board CB, respectively. The pads PD may be electrically connected to the circuit board pads PDC through conducting wires such as wires WR. However, the present disclosure is not limited thereto, and the pads PD may also be electrically connected to the circuit board pads PDC through via holes passing through the first substrate 110.

The circuit board CB may be a flexible printed circuit board (FPCB), a printed circuit board (PCB), a flexible printed circuit (FPC), or a flexible film such as a chip on film (COF).

The light emitting elements ED may be disposed in the display area DPA to correspond to the emission areas EA1 through EA3, respectively. One light emitting element ED may be disposed in one emission area EA1, EA2, or EA3.

The light emitting elements ED may be respectively disposed on the first electrode connection parts CTE1 in the display area DPA. Each of the light emitting elements ED may be an inorganic light emitting diode extending in a direction (e.g., the third direction DR3). Each of the light emitting elements ED may have a cylindrical shape, a disk shape, or a rod shape with a width greater than a height. However, the present disclosure is not limited thereto, and each of the light emitting elements ED may also have various shapes including shapes such as a rod, a wire and a tube, polygonal prisms such as a cube, a rectangular parallelepiped and a hexagonal prism, and a shape extending in a direction and having a partially inclined outer surface. In an example, a length of each light emitting element ED, the direction in which the light emitting element ED extends, or a length of each light emitting element ED in the third direction DR3 may be greater than a width in a horizontal direction, and the length of each light emitting element ED in the third direction DR3 may be 1 to 5 μm.

According to one or more embodiments, each of the light emitting elements ED may include a first connection electrode CNE1, a first semiconductor layer SEM1, an electron blocking layer EBL, an active layer MQW, a superlattice layer SL, and a second semiconductor layer SEM2. The first connection electrode CNE1, the first semiconductor layer SEM1, the electron blocking layer EBL, the active layer MQW, the superlattice layer SL, and the second semiconductor layer SEM2 may be sequentially stacked in the third direction DR3.

The first connection electrode CNE1 may be disposed on a first electrode connection part CTE1. The first connection electrode CNE1 may directly contact the first electrode connection part CTE1 and may send an emission signal transmitted to a pixel electrode AE to a light emitting element ED. The first connection electrode CNE1 may be an ohmic connection electrode. However, the present disclosure is not limited thereto, and the first connection electrode CNE1 may also be a Schottky connection electrode. Each of the light emitting elements ED may include at least one first connection electrode CNE1.

When each light emitting element ED is electrically connected to an electrode connection part CTE1 or CTE2, the first connection electrode CNE1 may reduce resistance due to contact between the light emitting element ED and the electrode connection part CTE1 or CTE2. The first connection electrode CNE1 may include a conductive metal. For example, the first connection electrode CNE1 may include at least any one of gold (Au), copper (Cu), tin (Sn), titanium (Ti), aluminum (Al), and silver (Ag). For example, the first connection electrode CNE1 may include a 9:1 alloy, an 8:2 alloy, or a 7:3 alloy of gold and tin or may include an alloy of copper, silver, and tin (SAC305).

The first semiconductor layer SEM1 may be disposed on the first connection electrode CNE1. The first semiconductor layer SEM1 may be a p-type semiconductor and may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer SEM1 may be any one or more of p-type doped AlGaInN, GaN, AlGaN, InGaN, AlN, and InN. The first semiconductor layer SEM1 may be doped with a p-type dopant, and the p-type dopant may be Mg, Zn, Ca, Se, Ba, or the like. For example, the first semiconductor layer SEM1 may be p-GaN doped with p-type Mg.

The electron blocking layer EBL may be disposed on the first semiconductor layer SEM1. The electron blocking layer EBL may prevent electrons flowing into the active layer MQW from being injected into other layers without recombining with holes in the active layer MQW. For example, the electron blocking layer EBL may be p-AlGaN doped with p-type Mg. A thickness of the electron blocking layer EBL may be in the range of, but not limited to, 10 to 50 nm. In one or more embodiments, the electron blocking layer EBL may be omitted.

The active layer MQW may be disposed on the electron blocking layer EBL. The active layer MQW may emit light through recombination of electrons-holes according to an emission signal received though the first semiconductor layer SEM1 and the second semiconductor layer SEM2. In one or more embodiments, in each light emitting element ED of the display device 10, the active layer MQW may emit light of the third color, that is, blue light whose central wavelength band is in the range of 450 to 495 nm.

The active layer MQW may include a material having a single or multiple quantum well structure. When the active layer MQW includes a material having a multiple quantum well structure, it may have a structure in which a plurality of well layers and a plurality of barrier layers are alternately stacked. Here, the well layers may be formed of InGaN, and the barrier layers may be formed of GaN or AlGaN, but the present disclosure is not limited thereto.

For example, the active layer MQW may have a structure in which a semiconductor material having a large band gap energy and a semiconductor material having a small band gap energy are alternately stacked or may include different Group III to V semiconductor materials depending on the wavelength band of light that it emits. Light emitted from the active layer MQW is not limited to blue light of the third color. In some cases, the active layer MQW may emit red light of the first color or green light of the second color.

The superlattice layer SL is disposed on the active layer MQW. The superlattice layer SL may relieve stress due to a difference in lattice constant between the second semiconductor layer SEM2 and the active layer MQW. For example, the superlattice layer SL may be formed of InGaN or GaN. A thickness of the superlattice layer SL may be about 50 to 200 nm. However, the superlattice layer SL may also be omitted.

The second semiconductor layer SEM2 may be disposed on the superlattice layer SL. The second semiconductor layer SEM2 may be an n-type semiconductor. The second semiconductor layer SEM2 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer SEM2 may be any one or more of n-type doped AlGaInN, GaN, AlGaN, InGaN, AlN, and InN. The second semiconductor layer SEM2 may be doped with an n-type dopant, and the n-type dopant may be Si, Ge, Sn, or the like. For example, the second semiconductor layer SEM2 may be n-GaN doped with n-type Si. A thickness of the second semiconductor layer SEM2 may be in the range of, but not limited to, 2 to 4 μm.

According to one or more embodiments, the second semiconductor layers SEM2 of the light emitting elements ED of the display device 10 may be connected to each other. The light emitting elements ED may share a part of the second semiconductor layer SEM2 as one common layer, and a plurality of layers disposed on the second semiconductor layer SEM2 may be spaced from each other. The second semiconductor layer SEM2 may include a base layer which extends in the first direction DR1 and the second direction DR2 to lie in the display area DPA and a part of the non-display area NDA and a plurality of protruding parts which protrude from the base layer and are spaced from each other. The layers of each light emitting element ED may be disposed on a protruding part of the second semiconductor layer SEM2 and spaced from those of another light emitting element ED, and the layers may constitute one light emitting element ED together with the protruding part of the second semiconductor layer SEM2. In the second semiconductor layer SEM2, a thickness of each protruding part that forms a part of a light emitting element ED may be greater than a thickness of the base layer that does not overlap the first semiconductor layer SEM1.

In addition, in the display device 10, the second semiconductor layer SEM2 may transmit an emission signal received through the second connection electrodes CNE2 and the second electrode connection parts CTE2 to the light emitting elements ED. As will be described later, the second connection electrodes CNE2 may be disposed on a surface of the base layer disposed in the non-display area NDA in the second semiconductor layer SEM2 of the light emitting elements ED and may be electrically connected to the common electrodes CE through the second electrode connection parts CTE2.

A third semiconductor layer SEM3 is disposed on the second semiconductor layer SEM2 of the light emitting elements ED. The third semiconductor layer SEM3 may be disposed in the display area DPA and a part of the non-display area NDA and may be entirely disposed on the base layer of the second semiconductor layer SEM2. The third semiconductor layer SEM3 may be an undoped semiconductor. The third semiconductor layer SEM3 may include the same material as the second semiconductor layer SEM2 but may be a material not doped with an n-type or p-type dopant. In one or more embodiments, the third semiconductor layer SEM3 may be, but is not limited to, at least any one of undoped InAlGaN, GaN, AlGaN, InGaN, AlN, and InN.

The third semiconductor layer SEM3 may not have conductivity, unlike the second semiconductor layer SEM2, and an emission signal transmitted to the pixel electrodes AE and the common electrodes CE may flow through the light emitting elements ED and the second semiconductor layer SEM2. In a process of manufacturing the light emitting elements ED, the second semiconductor layer SEM2 and the light emitting elements ED may be formed on the third semiconductor layer SEM3. A thickness of the third semiconductor layer SEM3 may be smaller than the thickness of each protruding part of the second semiconductor layer SEM2 and may be greater than the thickness of the base layer of the second semiconductor layer SEM2.

A plurality of second connection electrodes CNE2 may be disposed in the common electrode connection part CPA of the non-display area NDA. The second connection electrodes CNE2 may be disposed on the surface of the base layer of the second semiconductor layer SEM2. In addition, the second connection electrodes CNE2 may be directly disposed on the second electrode connection parts CTE2 and may transmit an emission signal received from the common electrodes CE to the light emitting elements ED. The second connection electrodes CNE2 may be made of the same material as the first connection electrodes CNE1. A thickness of each second connection electrode CNE2 in the third direction DR3 may be greater than a thickness of each first connection electrode CNE1.

A first insulating layer INS may be disposed on the surface of the base layer of the second semiconductor layer SEM2 and side surfaces of each of the light emitting elements ED. The first insulating layer INS may be around (e.g., surround) at least the light emitting elements ED. Because parts of the first insulating layer INS that is around (e.g., surrounds) the light emitting elements ED are disposed to correspond to the light emitting elements ED, they may be spaced from each other in the first direction DR1 and the second direction DR2 in a plan view. The first insulating layer INS may protect each of the light emitting elements ED and may insulate the second semiconductor layer SEM2 and the light emitting elements ED from other layers. The first insulating layer INS may include an inorganic insulating material such as silicon oxide ($SiO_x$), silicon nitride ($SiN_x$), silicon oxynitride ($SiO_xN_y$), aluminum oxide ($AlO_y$), or aluminum nitride ($AlN_x$).

First reflective layers RL1 may be around (e.g., surround) the side surfaces of the light emitting elements ED. The first reflective layers RL1 may be disposed in the display area DPA to correspond to the emission areas EA1 through EA3, and may be directly disposed on the first insulating layer INS disposed on the side surfaces of the light emitting elements ED. Because the first reflective layers RL1 around (e.g., surround) the light emitting elements ED that are spaced from each other, the first reflective layers RL1 may be spaced from each other in the first direction DR1 and the second direction DR2 in a plan view. The first reflective layers RL1 may reflect light emitted from the active layers MQW of the light emitting elements ED, and the light may travel toward the second substrate 210 instead of the first substrate 110.

The first reflective layers RL1 may include a metal material having high reflectivity, such as aluminum (Al). A thickness of each first reflective layer RL1 may be, but is not limited to, about 0.1 μm.

The heat dissipation substrate 510 may be disposed on a lower side that is opposite an upper side facing the color conversion substrate 200 from among both sides of the display substrate 100. The heat dissipation substrate 510 may generally have a shape similar to that of the first substrate 110 and may contact the lower side of the first substrate 110. According to one or more embodiments, at least a part of the heat dissipation substrate 510 may overlap the display area DPA of the display device 10 in the thickness direction (i.e. the third direction DR3), and the other part may overlap the non-display area NDA. The heat dissipation substrate 510 may include a material having high thermal conductivity to effectively dissipate heat generated from the display substrate 100 and the circuit board CB. For example, the heat dissipation substrate 510 may be made of a metal material having high thermal conductivity, such as tungsten (W), aluminum (Al), or copper (Cu).

In one or more embodiments, a part of the heat dissipation substrate 510 may be disposed on a lower surface of the circuit board CB to contact the circuit board CB. However, the present disclosure is not limited thereto. In one or more embodiments, the heat dissipation substrate 510 may be structured to efficiently dissipate heat generated in the display device 10, for example, heat generated from the light emitting elements ED.

The color conversion substrate 200 is disposed on the display substrate 100, and a protective layer PTF, the color control structures WCL, the color filters CF1 through CF3, second reflective layers RL2, the bank layer BNL, and the second substrate 210 are sequentially disposed from the light emitting elements ED. The layers disposed on a surface of the second substrate 210 that faces the first substrate 110 will now be sequentially described starting with the second substrate 210.

The second substrate 210 may be disposed to face the first substrate 110. The second substrate 210 may be a base substrate that supports a plurality of layers included in the color conversion substrate 200. The second substrate 210 may be made of a transparent material. For example, the second substrate 210 may include a transparent substrate such as a sapphire substrate or glass. However, the present disclosure is not limited thereto, and the second substrate 210 may also be made of a conductive substrate such as GaN, SiC, ZnO, Si, GaP, or GaAs.

The bank layer BNL may be disposed on a surface of the second substrate 210. The bank layer BNL may be around (e.g., surround) the first emission area EA1, the second emission area EA2, and the third emission area EA3. The bank layer BNL may include parts extending in the first direction DR1 and the second direction DR2 to form a grid pattern in the entire display area DPA. In addition, the bank layer BNL may also be disposed in the non-display area NDA and may completely cover the surface of the second substrate 210 in the non-display area NDA.

The bank layer BNL may include a plurality of openings OP1 through OP3 (e.g., see FIG. 8) exposing the second substrate 210 in the display area DPA. The openings OP1 through OP3 may include a first opening OP1 overlapping the first emission area EA1, a second opening OP2 overlapping the second emission area EA2, and a third opening OP3 overlapping the third emission area EA3. The openings OP1 through OP3 may correspond to the emission areas EA1 through EA3, respectively.

In one or more embodiments, the bank layer BNL may include silicon (Si). For example, the bank layer BNL may include a silicon monocrystalline layer. The bank layer BNL including silicon may be formed by a reactive ion etching (RIE) process. The bank layer BNL may be formed to have a high aspect ratio by controlling process conditions of the etching process.

The color filters CF1 through CF3 may be respectively disposed in the openings OP1 through OP3 of the bank layer BNL on the surface of the second substrate 210. The different color filters CF1 through CF3 may be spaced from each other with the bank layer BNL interposed between them, but the present disclosure is not limited thereto.

The color filters CF1 through CF3 may include a first color filter CF1, a second color filter CF2, and a third color filter CF3. The first color filter CF1 may be disposed in the first opening OP1 of the bank layer BNL to overlap the first emission area EA1. The second color filter CF2 may be disposed in the second opening OP2 of the bank layer BNL to overlap the second emission area EA2, and the third color filter CF3 may be disposed in the third opening OP3 of the bank layer BNL to overlap the third emission area EA3.

The color filters CF1 through CF3 may fill the openings OP1 through OP3, respectively, and a surface of each of the color filters CF1 through CF3 may be side by side with a surface of the bank layer BNL. That is, a thickness of each of the color filters CF1 through CF3 may be the same as a thickness of the bank layer BNL. However, the present disclosure is not limited thereto, and the surface of each of the color filters CF1 through CF3 may also protrude or may be recessed from the surface of the bank layer BNL. That is, the thickness of each of the color filters CF1 through CF3 may also be different from the thickness of the bank layer BNL.

The color filters CF1 through CF3 disposed to respectively correspond to the openings OP1 through OP3 of the bank layer BNL may form island-shaped patterns, but the present disclosure is not limited thereto. For example, each of the color filters CF1 through CF3 may also form a linear pattern extending in a direction (e.g., first direction DR1 or the second direction DR2) in the display area DPA. In this case, the openings OP1 through OP3 of the bank layer BNL may also extend in the direction (e.g., the first direction DR1 or the second direction DR2). In one or more embodiments, the first color filter CF1 may be a red color filter, the second color filter CF2 may be a green color filter, and the third color filter CF3 may be a blue color filter. Each of the color filters CF1 through CF3 may transmit only some of the light that passes through a color control structure WCL after being emitted from a light emitting element ED and may block transmission of other light.

The second reflective layers RL2 may be disposed in the openings OP1 through OP3 of the bank layer BNL. The second reflective layers RL2 may be disposed on side surfaces of the bank layer BNL, and may be around (e.g., surround) side surfaces of the color filters CF1 through CF3 disposed in the openings OP1 through OP3. The second reflective layers RL2 disposed in different openings OP1 through OP3 may be around (e.g., surround) different color filters CF1 through CF3, and may be spaced from each other in the first direction DR1 and the second direction DR2 in a plan view.

Like the first reflective layers RL1, the second reflective layers RL2 may reflect incident light. Some of the light incident on the color filters CF1 through CF3 after being emitted from the light emitting elements ED may be reflected by the second reflective layers RL2 toward an upper surface of the second substrate 210. The second reflective layers RL2 may include the same material as the first reflective layers RL1 described above and may include, for example, a metal material having high reflectivity such as aluminum (Al). A thickness of each of the second reflective layers RL2 may be, but is not limited to, about 0.1 μm.

The color control structures WCL may be disposed on the color filters CF1 through CF3. The color control structures WCL may overlap the first color filter CF1, the second color filter CF2, and the third color filter CF3 in the third direction DR3, and may be spaced from each other. The color control structures WCL may be disposed to correspond to the openings OP1 through OP3 disposed in the bank layer BNL. In one or more embodiments, the color control structures WCL may overlap the openings OP1 through OP3. The color control structures WCL may be formed as island-shaped patterns that are spaced from each other. However, the present disclosure is not limited thereto, and the color control structures WCL may also be formed as linear patterns extending in a direction (e.g., the first direction DR1 or the second direction DR2).

The color control structures WCL may convert or shift a peak wavelength of incident light into light of another specific peak wavelength and output the light. In one or more embodiments in which the light emitting elements ED emit blue light of the third color, the color control structures WCL may convert at least a part of the light emitted from the light emitting elements ED into yellow light of a fourth color. A part of the light of third color emitted from the light emitting elements ED may be converted into the yellow light of the fourth color by the color control structures WCL, and a mixture of the light of the third color and the light of the fourth color may be incident on each of the color filters CF1 through CF3. The first color filter CF1 may transmit red light of the first color from among the mixture of the light of the third color and the light of the fourth color and block transmission of light of other colors. Similarly, the second color filter CF2 may transmit green light of the second color from among the mixture of the light of the third color and the light of the fourth color and block transmission of light of other colors. The third color filter CF3 may transmit the blue light of the third color from among the mixture of the light of the third color and the light of the fourth color and block transmission of other colors.

Each of the color control structures WCL may include a base resin BRS and wavelength conversion particles WCP. The base resin BRS may include a light-transmitting organic material. For example, the base resin BRS may include epoxy resin, acrylic resin, cardo resin, or imide resin. The respective base resins BRS of the color control structures WCL may all be made of the same material, but the present disclosure is not limited thereto. The wavelength conversion particles WCP may be materials that convert the blue light of the third color into the yellow light of the fourth color. The wavelength conversion particles WCP may be quantum dots, quantum rods, or phosphors. The quantum dots include Group IV nanocrystals, Group II-VI compound nanocrystals, Group III-V compound nanocrystals, Group IV-VI nanocrystals, or a combination of the same.

In addition, each of the color control structures WCL may further include scatterers. The scatterers may be metal oxide particles or organic particles. The metal oxide may be, for example, titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and the organic particle material may be, for example, acrylic resin or urethane resin.

As a thickness of the color control structures WCL in the third direction DR3 increases, the content of the wavelength conversion particles WCP included in the color control structures WCP increases, thereby increasing the light conversion efficiency of the color control structures WCL. The thickness of the color control structures WCL may be designed in consideration of the light conversion efficiency of the wavelength conversion particles WCP.

The protective layer PTF may be disposed on the bank layer BNL and the color control structures WCL and may cover them. The protective layer PTF may be disposed over the display area DPA and the non-display area NDA. The protective layer PTF may protect the color control structures WCL in the display area DPA and planarize steps formed by the color control structures WCL.

The protective layer PTF may be disposed between the light emitting elements ED and the color control structures WCL and may prevent the wavelength conversion particles WCP of the color control structures WCL from being damaged by heat generated from the light emitting elements ED. The protective layer PTF may include an organic insulating material such as epoxy resin, acrylic resin, cardo resin, or imide resin.

An adhesive layer ADL may be disposed between the display substrate 100 and the color conversion substrate 200. The adhesive layer ADL may bond the display substrate 100 and the color conversion substrate 200 to each other and may be made of a transparent material to transmit light emitted from the light emitting elements ED. For example, the adhesive layer ADL may include an acrylic-based, siliconebased, or urethane-based material and may include a material that can be UV-cured or heat-cured.

The light exit substrate 300 may be disposed on the display substrate 100 or the color conversion substrate 200 and may include the hole mask layer ML, the third substrate 310, and the light exit patterns ELP1 through ELP3. The layers of the light exit substrate 300 may be sequentially disposed based on the first substrate 110.

The hole mask layer ML may be disposed on the second substrate 210 of the color conversion substrate 200. The hole mask layer ML may include a plurality of holes PH that are spaced from each other and may be directly disposed on the second substrate 210. The holes PH may be formed to pass through the hole mask layer ML and may serve as paths through which light output from the display substrate 100 and the color conversion substrate 200 passes. The hole mask layer ML may include a light blocking material in an area excluding the holes PH to prevent transmission of light. For example, the hole mask layer ML may be made of a metal or a black matrix as an opaque material.

According to one or more embodiments, the holes PH may be formed to respectively correspond to the light emitting elements ED of the display substrate 100 or the color filters CF1 through CF3 of the color conversion substrate 200. One hole PH may be formed to lie in one emission area EA1, EA2, or EA3 of the display area DPA. The holes PH may overlap the color filters CF1 through CF3 of the color conversion substrate 200 and the light emitting elements ED of the display substrate 100 in the thickness direction. The holes PH may be generally located in the centers of the emission areas EA1 through EA3 and may be smaller in size than the emission areas EA1 through EA3 or than the color filters CF1 through CF3 or the light emitting elements ED. Light emitted from the light emitting elements ED may pass through the color conversion substrate 200 and travel upward through the holes PH of the hole mask layer ML. Light emitted from the emission areas EA1 through EA3 may pass through the holes PH that are smaller than the light emitting elements ED and travel to the third substrate 310 and the light exit patterns ELP1 through ELP3.

The third substrate 310 and the light exit patterns ELP1 through ELP3 may be disposed on the hole mask layer ML. The light exit patterns ELP1 through ELP3 may be respectively disposed in a plurality of open holes HP (see FIG. 21) formed in the third substrate 310 and may be supported by the third substrate 310. According to one or more embodiments, the light exit patterns ELP1 through ELP3 may be disposed to correspond to the holes PH of the hole mask layer ML, respectively. Alternatively, the light exit patterns ELP1 through ELP3 may be disposed to correspond to different emission areas EA1 through EA3 or different light emitting elements ED, respectively. The light exit patterns ELP1 through ELP3 may be disposed to overlap the holes PH and the light emitting elements ED in the thickness direction (i.e. the third direction DR3).

The light exit patterns ELP1 through ELP3 may include a first light exit pattern ELP1 disposed to correspond to the first emission area EA1, a second light exit pattern ELP2 disposed to correspond to the second emission area EA2, and a third light exit pattern ELP3 disposed to correspond to the third emission area EA3. Because the light exit patterns ELP1 through ELP3 are disposed in different emission areas EA1 through EA3, they may be spaced from each other in the first direction DR1 and the second direction DR2. A plurality of first light exit patterns ELP1 may be spaced from each other in the first direction DR1, like a plurality of first emission areas EA1. A plurality of second light exit patterns ELP2 and a plurality of third light exit patterns ELP3 may also be spaced from each other in the first direction DR1, like a plurality of second emission areas EA2 and a plurality of third emission areas EA3, respectively. The first light exit pattern ELP1, the second light exit pattern ELP2, and the third light exit pattern ELP3 may be sequentially disposed and spaced from each other in the second direction DR2 and, as a basic unit, may be repeatedly arranged.

The third substrate 310 and the light exit patterns ELP1 through ELP3 may guide the path of light passing through the holes PH so that the light travels in a specific direction. The third substrate 310 and the light exit patterns ELP1 through ELP3 may each be formed of a transparent material but may be made of different materials, and light passing through the holes PH may travel in the light exit patterns ELP1 through ELP3 and then exit upward above the third substrate 310 and the light exit patterns ELP1 through ELP3. According to one or more embodiments, the third substrate 310 and the light exit patterns ELP1 through ELP3 may be made of materials having different refractive indices, and the light exit patterns ELP1 through ELP3 may include lens-type light exit parts to guide light emitted from the light emitting elements ED in a specific direction.

Figure 11:
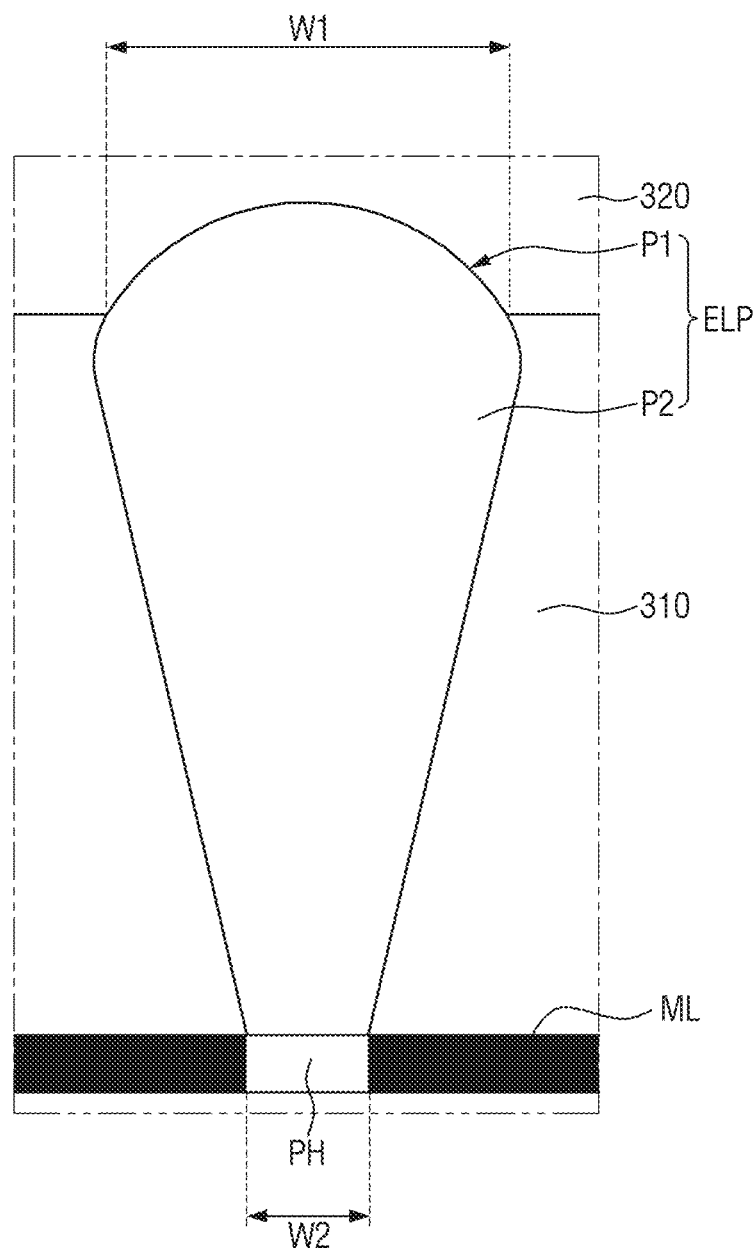
FIG. 11 is a cross-sectional view of a light exit pattern of a display device according to one or more embodiments.
Figure 12:
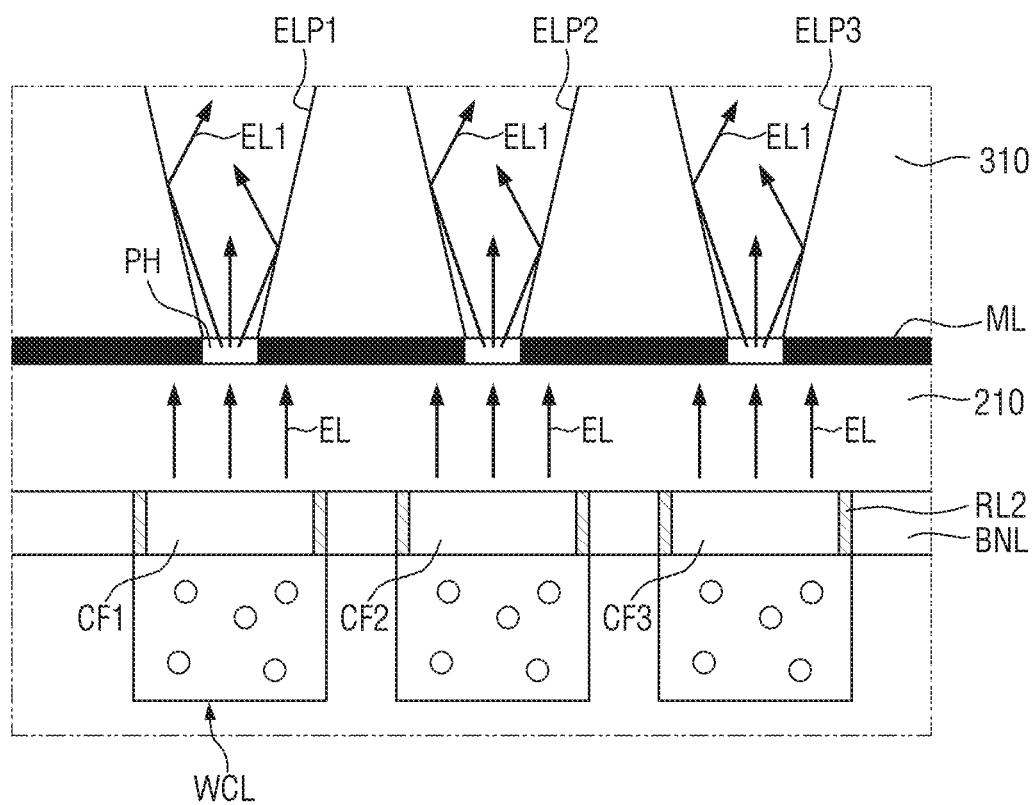
FIG. 12 is a schematic diagram illustrating light passing through a hole mask layer after being output from a color conversion substrate of a display device according to one or more embodiments.
Figure 13:
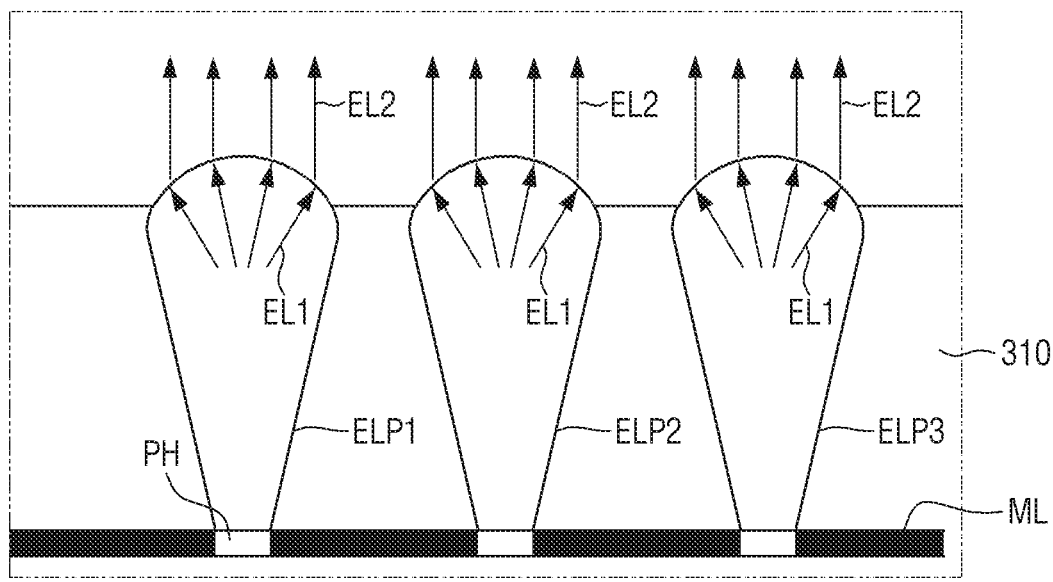
FIG. 13 is a schematic diagram illustrating light exiting from the light exit patterns after passing through a hole mask layer of a display device according to one or more embodiments.

FIG. 11 is a cross-sectional view of a light exit pattern ELP of the display device 10 according to one or more embodiments. FIG. 12 is a schematic diagram illustrating light passing through the hole mask layer ML after being output from the color conversion substrate 200 of the display device 10 according to one or more embodiments. FIG. 13 is a schematic diagram illustrating light exiting from the light exit patterns ELP1 through ELP3 after passing through the hole mask layer ML of the display device 10 according to one or more embodiments.

Referring to FIGS. 11 through 13 in addition to FIGS. 5 and 10, the display device 10 according to one or more embodiments may include the light exit patterns ELP1 through ELP3 and the third substrate 310 made of materials having different refractive indices. The light exit patterns ELP1 through ELP3 may be made of a material having a refractive index greater than that of the third substrate 310, and light EL (EL1) incident on the light exit patterns ELP1 through ELP3 may be totally reflected at an interface with the third substrate 310 to travel upward.

The light EL output from the color conversion substrate 200 may pass through the holes PH and enter the light exit patterns ELP1 through ELP3 (EL1 of FIG. 12). Each of the light exit patterns ELP1 through ELP3 may have a light incident part which is a part in contact with a hole PH and formed to correspond to the hole PH and may have a diameter equal to a diameter W2 of at least the hole PH. The light EL1 passing through the holes PH may enter and travel in the light exit patterns ELP1 through ELP3, and then a part of the light EL1 may travel toward side surfaces at which the light exit patterns ELP1 through ELP3 are in contact with the third substrate 310, and the other part may travel toward a light exit part located at the top of each of the light exit patterns ELP1 through ELP3.

According to one or more embodiments, each of the light exit patterns ELP1 through ELP3 may include a first part P1 which is disposed in an open hole formed in the third substrate 310 and is in contact with the third substrate 310 and a second part P2 which is located on the first part P1 and protrudes from an upper surface of the third substrate 310. Because the light exit substrate 300 includes the light exit patterns ELP1 through ELP3 whose second parts P2 protrude from the upper surface of the third substrate 310, an upper surface of the light exit substrate 300 may have surface roughness due to the light exit patterns ELP1 through ELP3. However, the present disclosure is not limited thereto, and the light exit substrate 300 may also further include a layer disposed on the third substrate 310 to have a smooth surface.

Each of the light exit patterns ELP1 through ELP3 may be inserted into an open hole after the open hole is formed in the third substrate 310 and may include the first part P1 and the second part P2 distinguished from each other according to a thickness of the third substrate 310 and a thickness of the light exit pattern ELP1, ELP2, or ELP3. The first part P1 and the second part P2 may be formed of substantially the same material but may be distinguished according to their relative positions with respect to the third substrate 310. However, the present disclosure is not limited thereto. In one or more embodiments, each of the light exit patterns ELP1 through ELP3 may include the first part P1 and the second part P2 made of different materials.

In each of the light exit patterns ELP1 through ELP3, a lower side of the first part P1 may be smaller than a maximum diameter W1 of the light exit pattern ELP1, ELP2, or ELP3 or a maximum diameter W1 of the second part P2, and side surfaces of the first part P1 of the light exit pattern ELP1, ELP2, or ELP3 may be inclined. The lower side of the first part P1 may have substantially the same diameter as a hole PH of the hole mask layer ML. A diameter of the first part P1 may increase from the lower side toward an upper side, and the side surfaces in contact with the third substrate 310 may be inclined. Because the light exit patterns ELP1 through ELP3 include a material having a refractive index greater than that of the third substrate 310, light travelling toward the side surfaces of the first part P1 from among the light EL1 incident on the first part P1 of each of the light exit patterns ELP1 through ELP3 may be totally reflected at the interface with the third substrate 310. Each of the light exit patterns ELP1 through ELP3 may guide the light EL1 passing through a hole PH so that the light EL1 exits from the second part P2 without being lost to the third substrate 310.

The light EL1 incident on each of the light exit patterns ELP1 through ELP3 may travel in the first part P1 and enter the second part P2 of the light exit pattern ELP1, ELP2, or ELP3. The second part P2 may have a shape that enables incident light to be emitted to the outside without being totally reflected. According to one or more embodiments, the second part P2 of each of the light exit patterns ELP1 through ELP3 may protrude from the upper surface of the third substrate 310 and may have a curved outer surface. A part in which the third substrate 310 is not disposed may be the outside of the display device 10 and may have a smaller refractive index than the third substrate 310. Total reflection may occur at an interface between each of the light exit patterns ELP1 through ELP3 made of a material having a high refractive index and the outside depending on an incident angle of light. The second part P2 of each of the light exit patterns ELP1 through ELP3 may be curved so that the incident light EL1 is not totally reflected, and most of the light may exit from the second part P2 (EL2 of FIG. 13).

Because the light exit patterns ELP1 through ELP3 are disposed to respectively correspond to the holes PH of the hole mask layer ML or the emission areas EA1 through EA3, light emitted from the light emitting elements ED may pass through the light exit patterns ELP1 through ELP3 while passing through the light exit substrate 300 to exit. The light exit patterns ELP1 through ELP3 may guide incident light so that the incident light is not lost to the third substrate 310 and may guide light to exit from within the emission areas EA1 through EA3 defined as areas where the light emitting elements ED or the color filters CF1 through CF3 are disposed. Because the display device 10 includes the light exit substrate 300 disposed on the light emitting elements ED or the color conversion substrate 200, light emitted from the light emitting elements ED may exit from within the emission areas EA1 through EA3 and may be prevented from being mixed in color with light emitted from adjacent emission areas EA1 through EA3.

For example, because the second part P2 of each of the light exit patterns ELP1 through ELP3 is curved, it may serve as a lens that guides the incident light EL1 to exit in a direction perpendicular (or substantially perpendicular) to the upper surface of the third substrate 310. A curvature of the second part P2 of each of the light exit patterns ELP1 through ELP3, a distance between a hole PH and the second part P2, and the thickness of the third substrate 310 may be adjusted to control the travelling direction of the exiting light EL2.

The light EL emitted from the light emitting elements ED and the color conversion substrate 200 may generally travel upward above the second substrate 210. Some (EL1 of FIG. 12) of the light EL may enter the holes PH of the hole mask layer ML and travel to the light exit patterns ELP1 through ELP3, and the rest may enter a part other than the holes PH and thus may be blocked. Some of the light EL1 incident on the holes PH and travelling to the light exit patterns ELP1 through ELP3 may have an incident angle in a direction perpendicular (or substantially perpendicular) to the hole mask layer ML and may travel in a vertical direction within the light exit patterns ELP1 through ELP3 to exit from the second parts P2.

However, some of the light incident on each hole PH may have an incident angle inclined from a normal line crossing the center of the hole PH. Light having a specific incident angle may travel in each of the light exit patterns ELP1 through ELP3 in an inclined direction instead of the vertical direction or may be totally reflected in the inclined direction at an interface between the first part P1 and the third substrate 310. Among the above light, light incident on an interface between the second part P2 and the outside may be refracted at the interface to exit. Here, when the incident angle of the light incident on the interface between the second part P2 and the outside is adjusted, the light EL2 exiting to the outside may be induced to travel in a direction perpendicular (or substantially perpendicular) to the upper surface of the third substrate 310.

The incident angle of light incident on the interface between the second part P2 and the outside may be determined by adjusting the curvature of the outer surface of the second part P2 and the thickness of the first part P1 or the third substrate 310. When a hole PH of the hole mask layer ML is placed on a focal plane of the second part P2 of each of the light exit patterns ELP1 through ELP3, the light EL passing through the hole PH with a specific incident angle may be refracted at the interface between the second part P2 and the outside to exit in the direction perpendicular (or substantially perpendicular) to the upper surface of the third substrate 310. In the display device 10, the light EL2 exiting from the light exit patterns ELP1 through ELP3 may be induced to travel in the direction perpendicular (or substantially perpendicular) to the upper surface of the third substrate 310 by adjusting the thickness of the third substrate 310 of the light exit substrate 300 and the curvature of the second part P2 of each of the light exit patterns ELP1 through ELP3. In the display device 10, light emitted from the light exit substrate 300 may not be mixed in color with light emitted from adjacent emission areas EA1 through EA3, and upward light emission efficiency may be improved.

A process of manufacturing the display device 10 according to one or more embodiments will now be described with reference to other drawings.

FIGS. 14-21 are cross-sectional views illustrating a process of manufacturing a display device according to one or more embodiments. FIGS. 14-21 schematically illustrate a process of forming a display substrate 100 and a process of forming a light exit substrate 300. A process of forming a color conversion substrate 200 is briefly illustrated, and the order of forming each layer is mainly illustrated.

Figure 14:
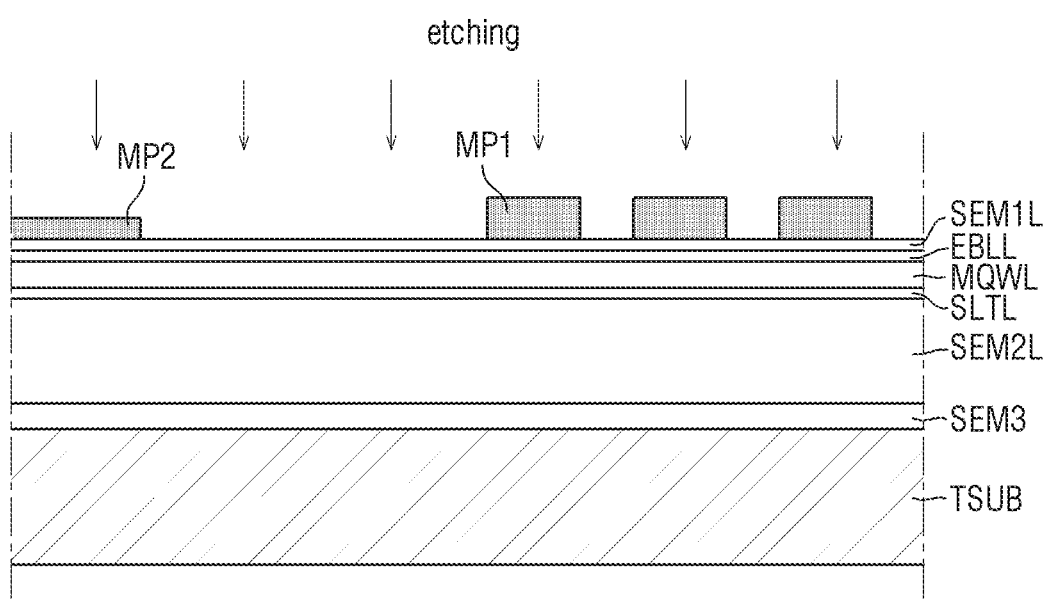
FIGS. 14-21 are cross-sectional views illustrating a process of manufacturing a display device according to one or more embodiments.
Figure 15:
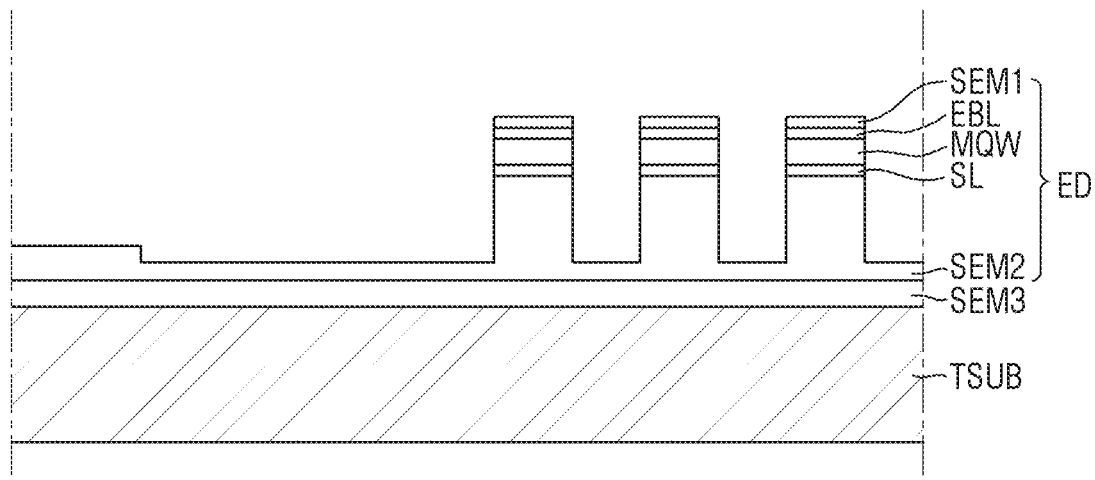

Referring to FIGS. 14 and 15, a plurality of semiconductor material layers SEM3, SEM2L, SLTL, MQWL, EBLL, and SEM1L are formed on a target substrate TSUB.

First, the target substrate TSUB is prepared, and the semiconductor material layers SEM3, SEM2L, SLTL, MQWL, EBLL, and SEM1L are sequentially formed on the target substrate TSUB. The semiconductor materials SEM3, SEM2L, SLTL, MQWL, EBLL, and SEM1L may be formed by epitaxial growth. The method of forming the semiconductor material layers SEM3, SEM2L, SLTL, MQWL, EBLL, and SEM1L may be electron beam deposition, physical vapor deposition (PVD), chemical vapor deposition (CVD), plasma laser deposition (PLD), dual-type thermal evaporation, sputtering, metal-organic chemical vapor deposition (MOCVD), or the like.

For example, a third semiconductor layer SEM3 is formed on the target substrate TSUB. The third semiconductor layer SEM3 may be disposed to reduce a difference in lattice constant between a second semiconductor material layer SEM2L and the target substrate TSUB. Next, the second semiconductor material layer SEM2L, a superlattice material layer SLTL, an active material layer MQWL, an electron blocking material layer EBLL, and a first semiconductor material layer SEM1L are sequentially formed on the third semiconductor layer SEM3.

Next, the semiconductor material layers SEM2L, SLTL, MQWL, EBLL, and SEM1L are etched to form a plurality of light emitting elements ED.

For example, a plurality of first mask patterns MP1 and a second mask pattern MP2 are formed on the first semiconductor material layer SEM1L. The first mask patterns MP1 and the second mask pattern MP2 may be hard masks including an inorganic material or photoresist masks including an organic material. The first mask patterns MP1 may be formed to be thicker than the second mask pattern MP2 so that the semiconductor material layers SEM2L, SLTL, MQWL, EBLL, and SEM1L under the first mask patterns MP1 are not etched.

The semiconductor material layers SEM2L, SLTL, MQWL, EBLL, and SEM1L are partially etched using the first mask patterns MP1 and the second mask pattern MP2 as a mask. The semiconductor material layers SEM2L, SLTL, MQWL, EBLL, and SEM1L disposed on the target substrate TSUB may be partially etched and removed, and unetched parts may form the light emitting elements ED. The process of etching the semiconductor material layers SEM2L, SLTL, MQWL, EBLL, and SEM1L may be any one of a dry etching process or a wet etching process and is not particularly limited. For example, the process of etching the semiconductor material layers SEM2L, SLTL, MQWL, EBLL, and SEM1L may be reactive ion etching (RIE), deep reactive ion etching (DRIE), or inductively coupled plasma reactive ion etching (ICP-RIE). Dry etching may be suitable for vertical etching because anisotropic etching is possible. When the above etching methods are used, an etchant may be, but is not limited to, $Cl_2$ or $O_2$.

The semiconductor material layers SEM2L, SLTL, MQWL, EBLL, and SEM1L overlapping the first mask patterns MP1 may not be etched but may form the light emitting elements ED. Among the semiconductor material layers SEM2L, SLTL, MQWL, EBLL, and SEM1L overlapping the second mask pattern MP2, the superlattice material layer SLTL, the active material layer MQWL, the electron blocking material layer EBLL, and the first semiconductor material layer SEM1L may be etched and removed as the second mask pattern MP2 is etched, and a part of the second semiconductor material layer SEM2L and the third semiconductor layer SEM3 may remain unetched. Among the semiconductor material layers SEM2L, SLTL, MQWL, EBLL, and SEM1L not overlapping the mask patterns MP1 and MP2, the superlattice material layer SLTL, the active material layer MQWL, the electron blocking material layer EBLL, and the first semiconductor material layer SEM1L may be etched and removed, and the etching process may be adjusted so that a part of the second semiconductor material layer SEM2L and the third semiconductor layer SEM3 remain unetched. For example, the second semiconductor material layer SEM2L may be formed to be relatively thicker at an edge of the target substrate TSUB than in an adjacent area to set a position at which a second connection electrode CNE2 to be described later is to be disposed.

Figure 16:
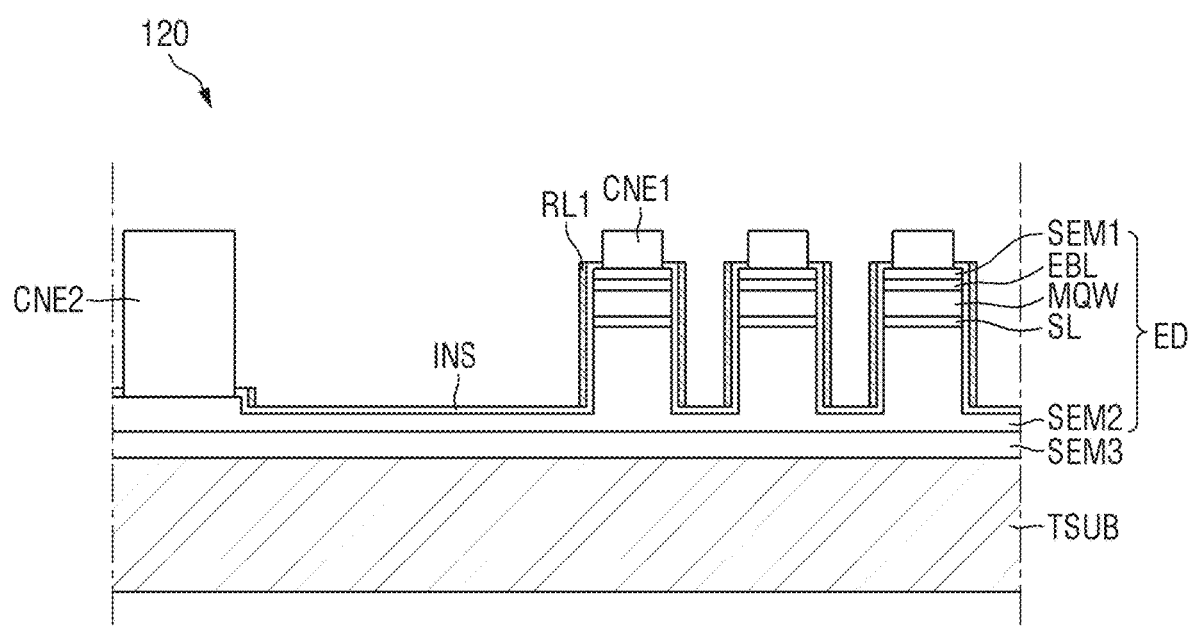

Next, referring to FIG. 16, a first insulating layer INS and first reflective layers RL1 around (e.g., surrounding) the light emitting elements ED are formed, and a plurality of connection electrodes CNE1 and CNE2 are formed on the light emitting elements ED and a second semiconductor layer SEM2.

Each of the first insulating layer INS and the first reflective layers RL1 may be formed by applying a material for forming the layer on the target substrate TSUB and then partially etching the material. The first insulating layer INS may be formed by forming an insulating material layer to completely cover the light emitting elements ED and an upper surface of the second semiconductor layer SEM2 and then removing the insulating material layer to partially expose upper surfaces the light emitting elements ED and the upper surface of the second semiconductor layer SEM2. The first reflective layers RL1 may be formed by forming a reflective material layer to completely cover the first insulating layer INS, the light emitting elements ED, and the upper surface of the second semiconductor layer SEM2 and then removing the reflective material layer to expose the upper surfaces of the light emitting elements ED and a part of the upper surface of the second semiconductor layer SEM2. The connection electrodes CNE1 and CNE2 may be respectively disposed in areas from which the first insulating layer INS and the first reflective layers RL1 are removed. First connection electrodes CNE1 may be disposed on first semiconductor layers SEM1 of the light emitting elements ED, respectively, and the second connection electrode CNE2 may be disposed on the exposed part of the upper surface of the second semiconductor layer SEM2. By performing the above process, a light emitting element layer 120 including the light emitting elements ED formed on the target substrate TSUB may be formed.

Figure 17:
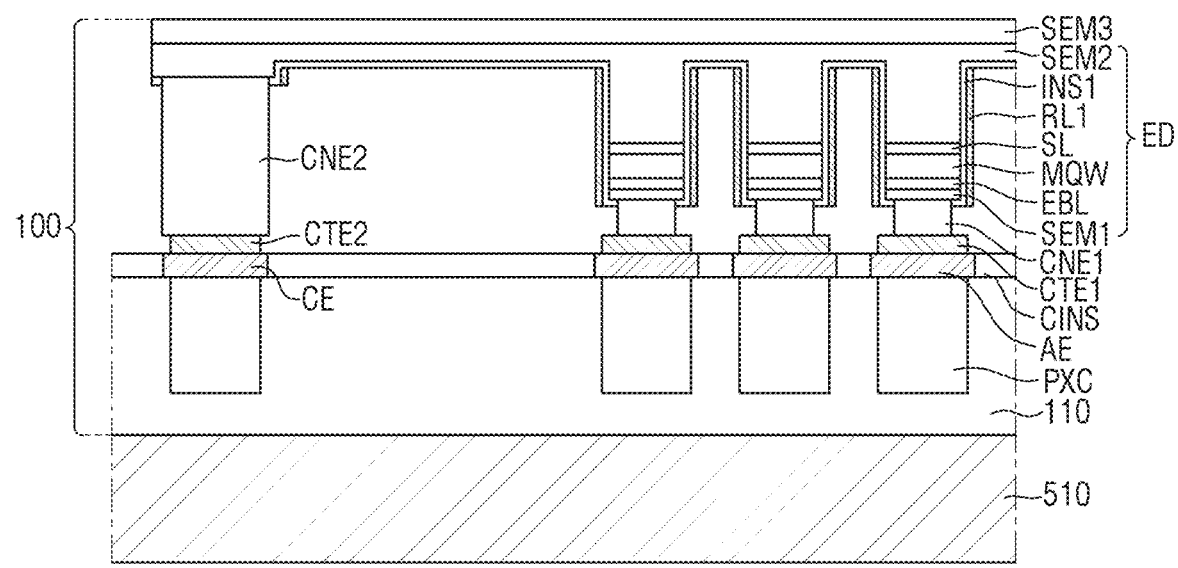
Figure 17:
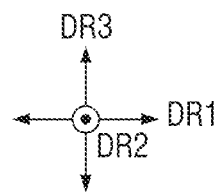

Next, referring to FIG. 17, the light emitting element layer 120 is disposed on a first substrate 110 including a plurality of pixel circuit units PXC, a common electrode CE, pixel electrodes AE, and electrode connection parts CTE1 and CTE2, and the target substrate TSUB is removed to form the display substrate 100. The light emitting element layer 120 may be disposed such that the connection electrodes CNE1 and CNE2 correspond to the electrode connection parts CTE1 and CTE2, respectively. An upper part of the light emitting element layer 120 is disposed to face an upper surface of the first substrate 110, and the target substrate TSUB is removed when the connection electrodes CNE1 and CNE2 come into contact with the electrode connection parts CTE1 and CTE2, respectively, thereby forming the display substrate 100.

Figure 18:
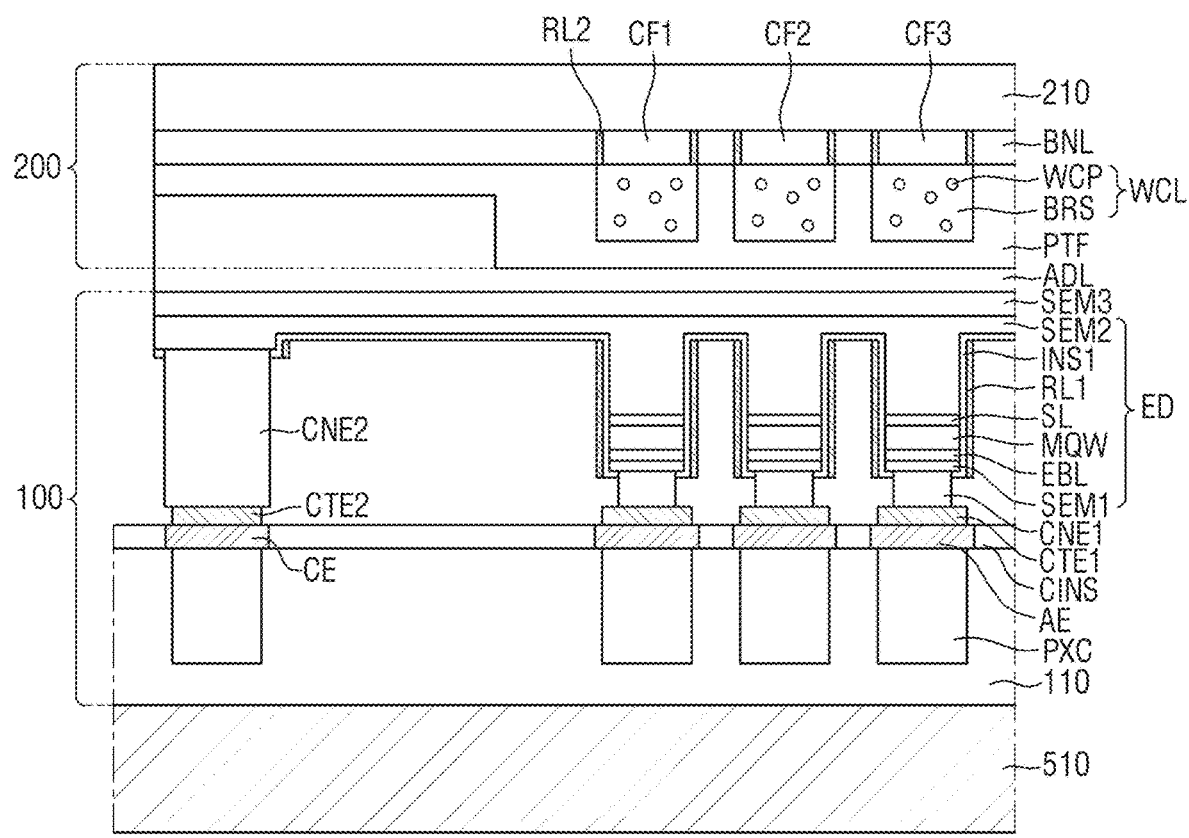
Figure 18:
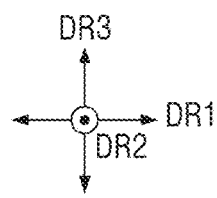

Next, referring to FIG. 18, the color conversion substrate 200 is disposed on the display substrate 100. The color conversion substrate 200 may include a bank layer BNL, second reflective layers RL2, color filters CF1 through CF3, color control structures WCL, and a protective layer PTF formed on a second substrate 210 and may be disposed on the display substrate 100 through an adhesive layer ADL. In the color conversion substrate 200, the above layers may be sequentially formed on a surface of the second substrate 210, and the surface of the second substrate 210 may be placed to face the first substrate 110 of the display substrate 100.

Figure 19:
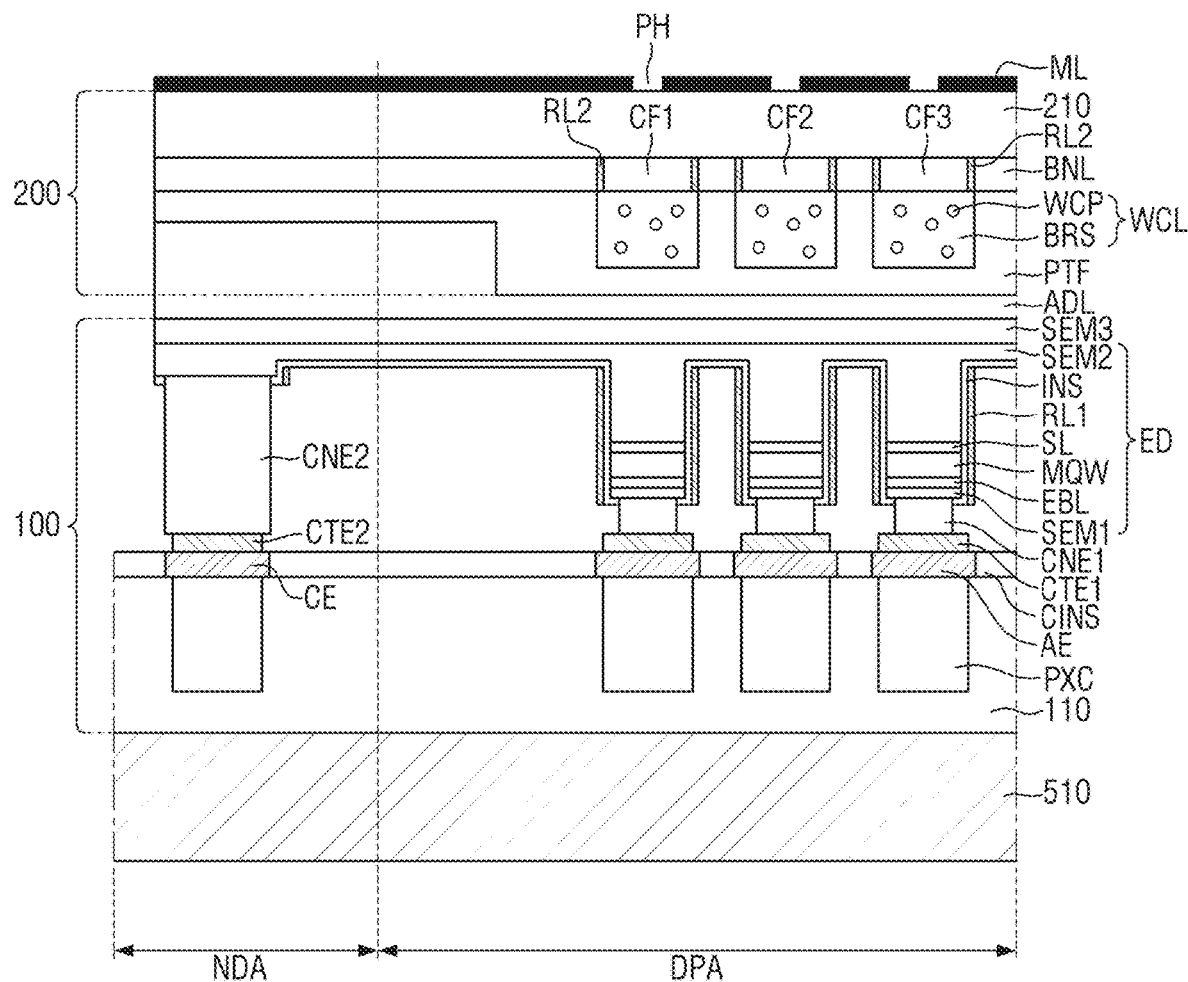

Next, referring to FIG. 19, a hole mask layer ML is formed on the second substrate 210 of the color conversion substrate 200. The hole mask layer ML may include a plurality of holes PH formed to correspond to the light emitting elements ED or emission areas EA1 through EA3. The hole mask layer ML may be disposed by placing a metal layer on the other surface of the second substrate 210 and then forming the holes PH in the metal layer. However, the present disclosure is not limited thereto, and when the holes PH are formed in the hole mask layer ML in a separate process, the hole mask layer ML may be disposed on the other surface of the second substrate 210 as it is.

Figure 20:
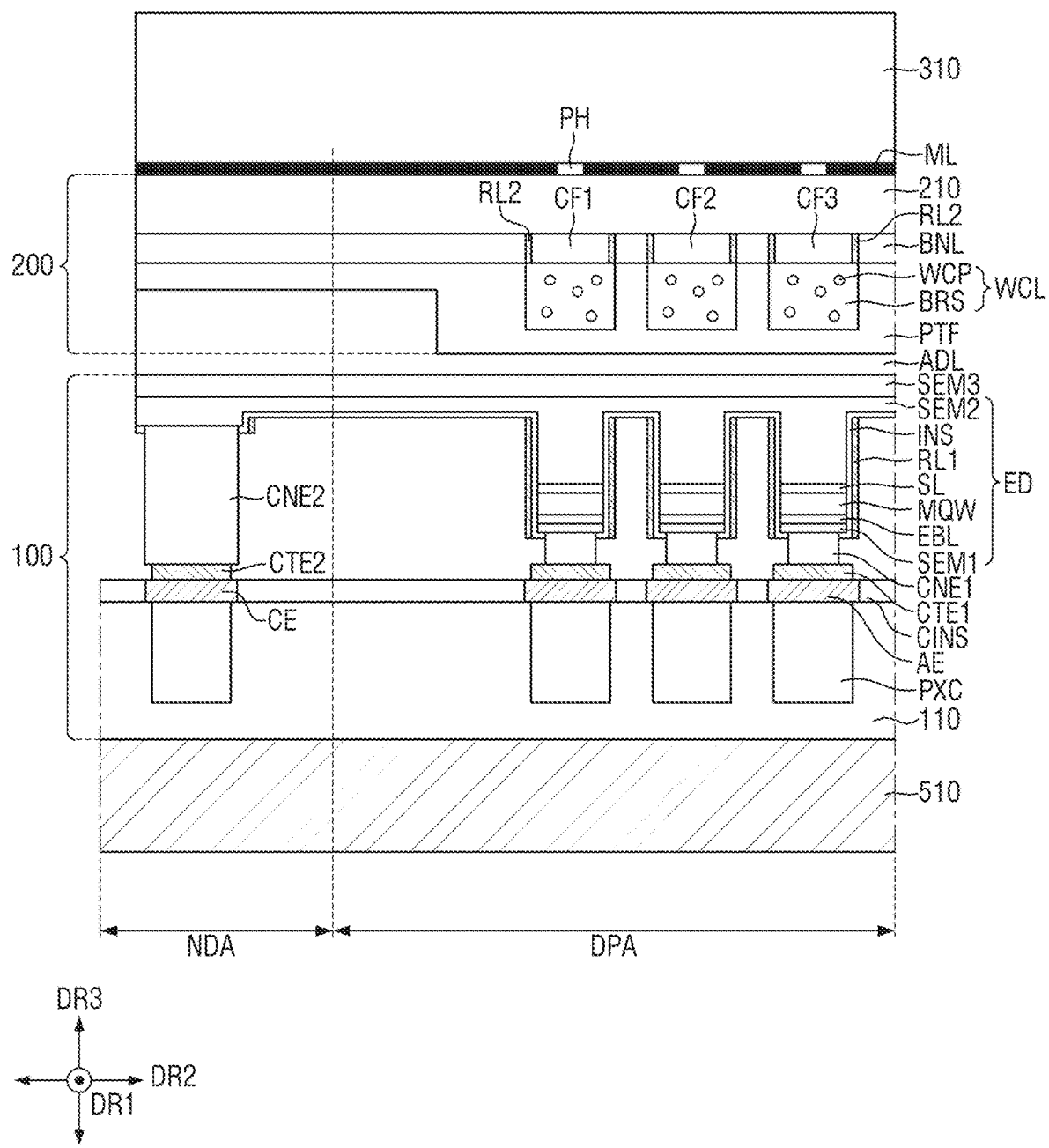
Figure 21:
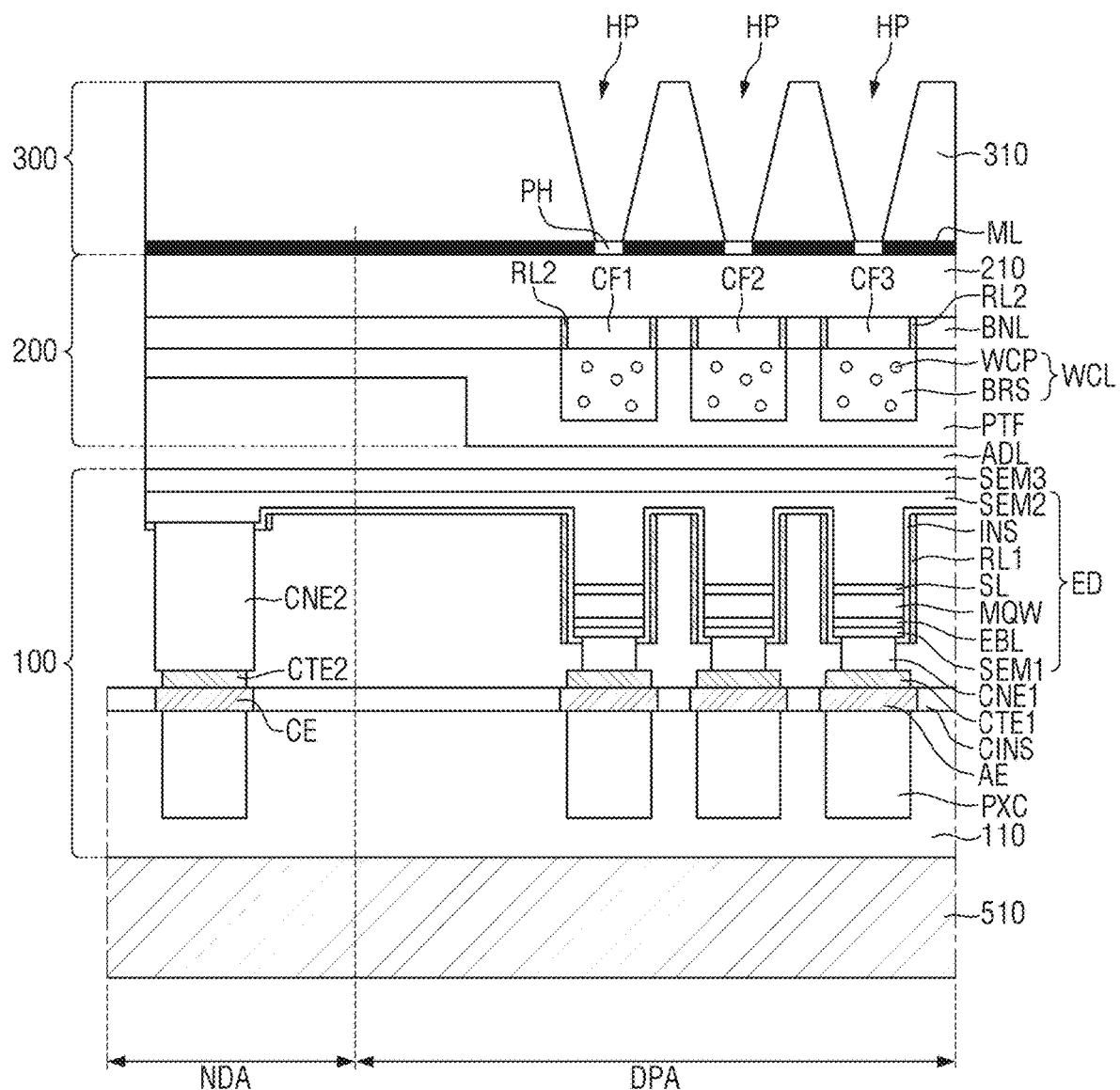

Next, referring to FIGS. 20 and 21, a third substrate 310 is disposed on the hole mask layer ML. The third substrate 310 may be disposed on the hole mask layer ML in a state where open holes HP in which light exit patterns ELP1 through ELP3 are disposed are not formed, and parts of the third substrate 310 disposed on the hole mask layer ML may be etched to form the open holes HP. The open holes HP may be formed to correspond to the holes PH of the hole mask layer ML or the emission areas EA1 through EA3.

In each of the open holes HP formed in the third substrate 310, a diameter of a lower end may be equal to or greater than a diameter of a hole PH, and a diameter of an upper end may be greater than the diameter of the lower end. The open holes HP of the third substrate 310 may have inclined side surfaces, and each of the light exit patterns ELP1 through ELP3 disposed in the open holes HP may be formed such that an interface between a first part P1 and the third substrate 310 is inclined.

Next, although not illustrated in the drawings, the display device 10 may be manufactured by forming a plurality of light exit patterns ELP1 through ELP3 disposed in the open holes HP of the third substrate 310, respectively. The light exit patterns ELP1 through ELP3 may fill the open holes HP of the third substrate 310, and a second part P2 protruding from an upper surface of the third substrate 310 may have a curved outer surface to have a lens shape. In one or more embodiments, the light exit patterns ELP1 through ELP3 may be formed by disposing an organic material having a high refractive index in the open holes HP and then reflowing the organic material by applying heat to the organic material. The curved second part P2 of each of the light exit patterns ELP1 through ELP3 may be made of an organic material and may be formed by reflowing a pattern with a protruding center. Here, the curvature of the second part P2 may be adjusted by adjusting the size of the protruding pattern and conditions of the reflow process.

Hereinafter, various embodiments of the display device 10 will be described with further reference to other drawings.

Figure 22:
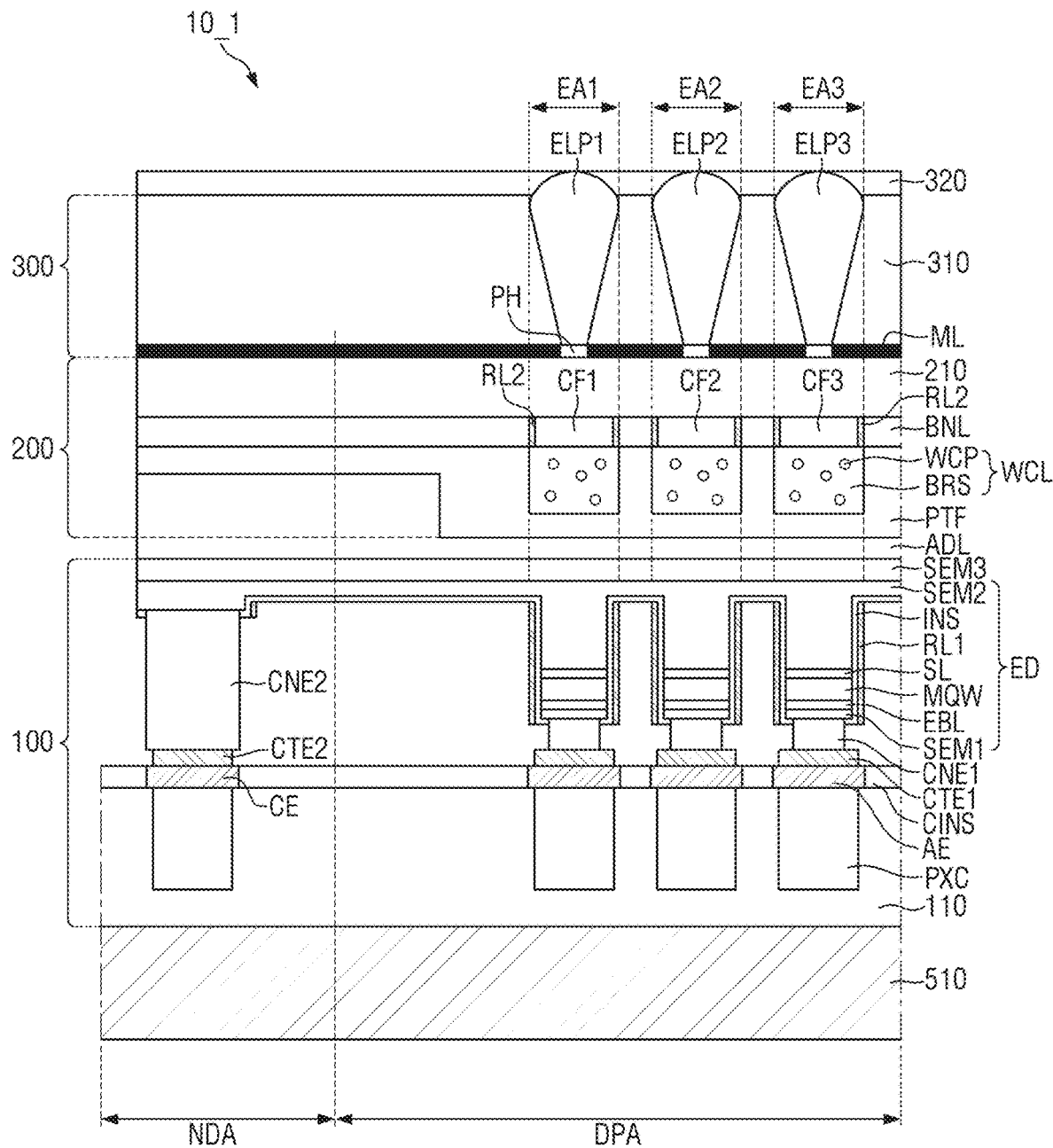
FIG. 22 is a cross-sectional view of a part of a display device according to one or more embodiments.
Figure 23:
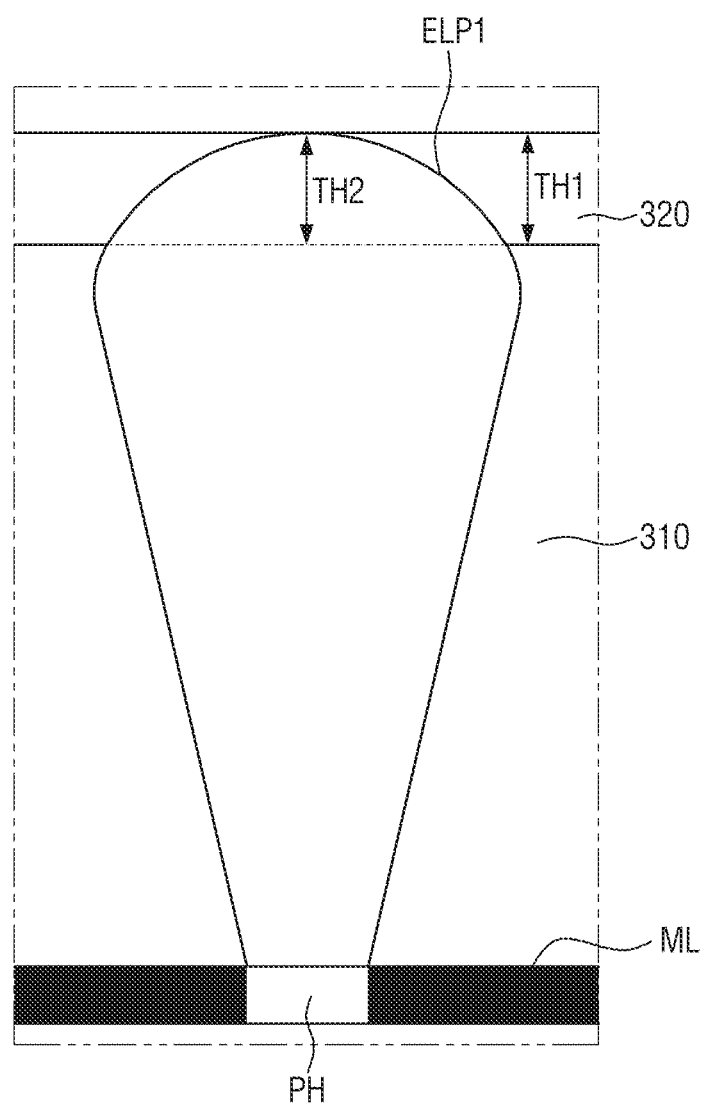
FIG. 23 is a cross-sectional view of a light exit pattern included in the display device of FIG. 22.

FIG. 22 is a cross-sectional view of a part of a display device 10_1 according to one or more embodiments. FIG. 23 is a cross-sectional view of a light exit pattern ELP1 included in the display device 10_1 of FIG. 22.

Referring to FIGS. 22 and 23, in the display device 10_1 according to one or more embodiments, a light exit substrate 300 may further include a capping layer 320. The current embodiment is different from the embodiment of FIG. 5 in that the light exit substrate 300 further includes the capping layer 320. Therefore, redundant description will be omitted, and differences will be mainly described below.

The capping layer 320 may be entirely disposed on an upper surface of a third substrate 310 and may cover or surround a second part P2 of each of light exit patterns ELP1 through ELP3. Because the capping layer 320 includes a transparent material, light may be emitted even if the capping layer 320 covers the light exit patterns ELP1 through ELP3.

According to one or more embodiments, a thickness TH1 of the capping layer 320 may be the same as a thickness TH2 of the second part P2 of each of the light exit patterns ELP1 through ELP3, and the capping layer 320 may cover the second part P2 of each of the light exit patterns ELP1 through ELP3. Although the light exit substrate 300 includes the light exit patterns ELP1 through ELP3, its upper surface may be made flat by the capping layer 320.

Because the light exit substrate 300 includes the capping layer 320, an interface between the second part P2 and the capping layer 320 may be formed in a light exit part of each of the light exit patterns ELP1 through ELP3. The capping layer 320 may include a material that may not allow light exiting from the light exit patterns ELP1 through ELP3 to be refracted toward adjacent emission areas EA1 through EA3. In one or more embodiments, the capping layer 320 may be made of a material having a smaller refractive index than the light exit patterns ELP1 through ELP3. For example, the light exit patterns ELP1 through ELP3 may include a material having a greater refractive index than the third substrate 310 and the capping layer 320, and the capping layer 320 may include a material having the same refractive index as the third substrate 310 or having a greater refractive index than the third substrate 310. In the display device 10_1, the upper surface of the light exit substrate 300 including the capping layer 320 may be planarized, and light emitted from light emitting elements ED may be smoothly output upward even if the capping layer 320 covers the light exit patterns ELP1 through ELP3.

Figure 24:
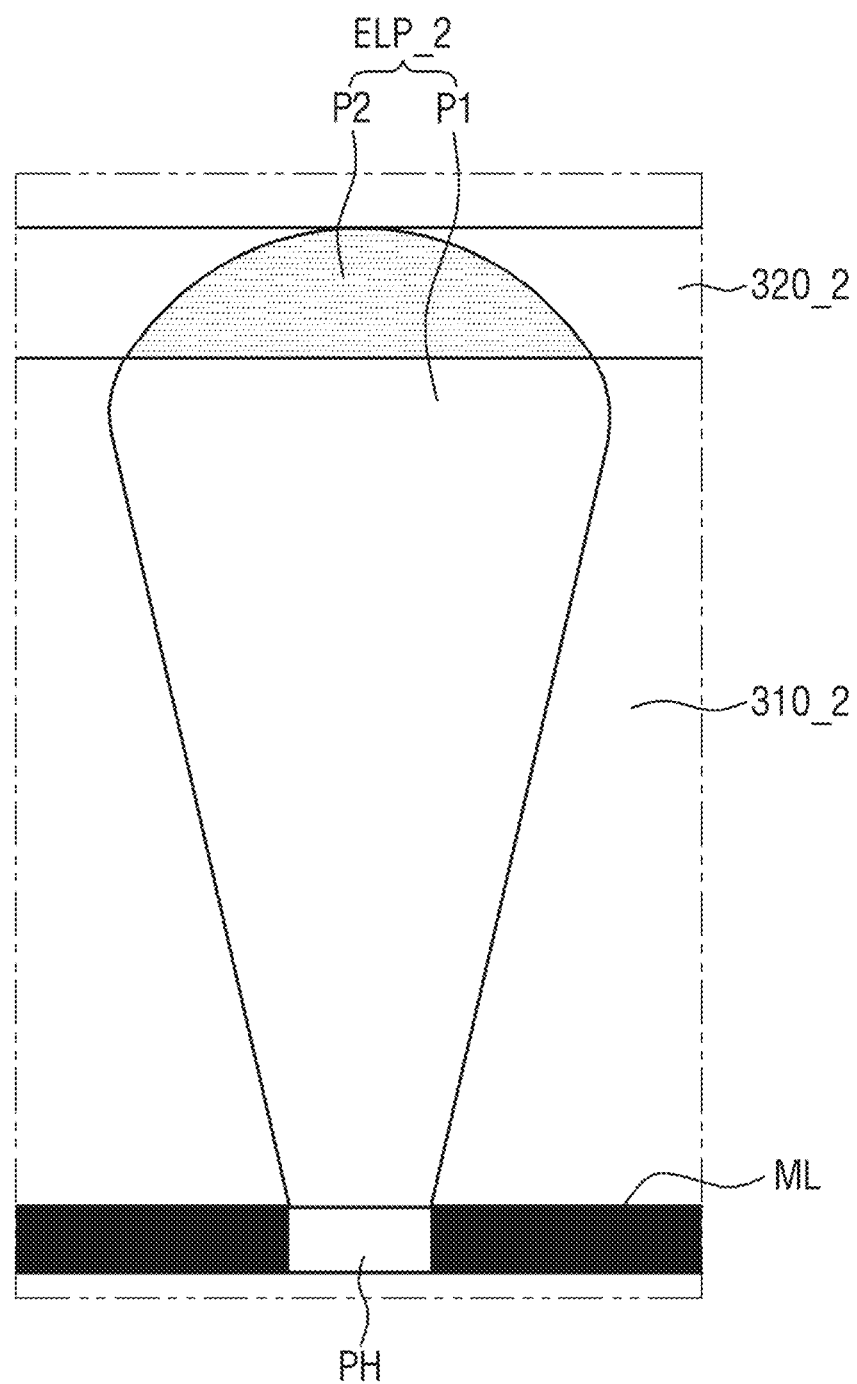
FIG. 24 is a cross-sectional view of a light exit pattern of a display device according to one or more embodiments.

FIG. 24 is a cross-sectional view of a light exit pattern ELP_2 of a display device according to one or more embodiments.

Referring to FIG. 24, in the display device 10, a first part P1 and a second part P2 of the light exit pattern ELP_2 may have different refractive indices. In the light exit pattern ELP_2, the first part P1 and the second part P2 distinguished by their positions corresponding to positions of a third substrate 310_2 and a capping layer 320_2 have different refractive indices. Thus, upward emission efficiency of light emitted from a light emitting element ED can be further improved. The current embodiment is the same as the embodiment of FIG. 23 except that the light exit pattern ELP_2 has different refractive indices.

According to one or more embodiments, in the light exit pattern ELP_2, the second part P2 protruding from an upper surface of the third substrate 310_2 may include a material having a greater refractive index than the first part P1. In the light exit pattern ELP_2, the first part P1 disposed in an open hole of the third substrate 310_2 and the second part P2 disposed on the first part P1 are made of different materials, but the material of the second part P2 may have a greater refractive index than the material of the first part P1. Light incident from the first part P1 to the second part P2 may be refracted at an interface between them. Because the second part P2 has a greater refractive index than the first part P1, the refracted light may travel inside an emission area EA1, EA2, or EA3 without travelling to other neighboring emission areas EA1 through EA3. Most of the light emitted from the display device 10 may be emitted upward from an area corresponding to each emission area EA1, EA2, or EA3 and may be hardly mixed in color with light emitted from other neighboring emission areas EA1 through EA3.

Figure 25:
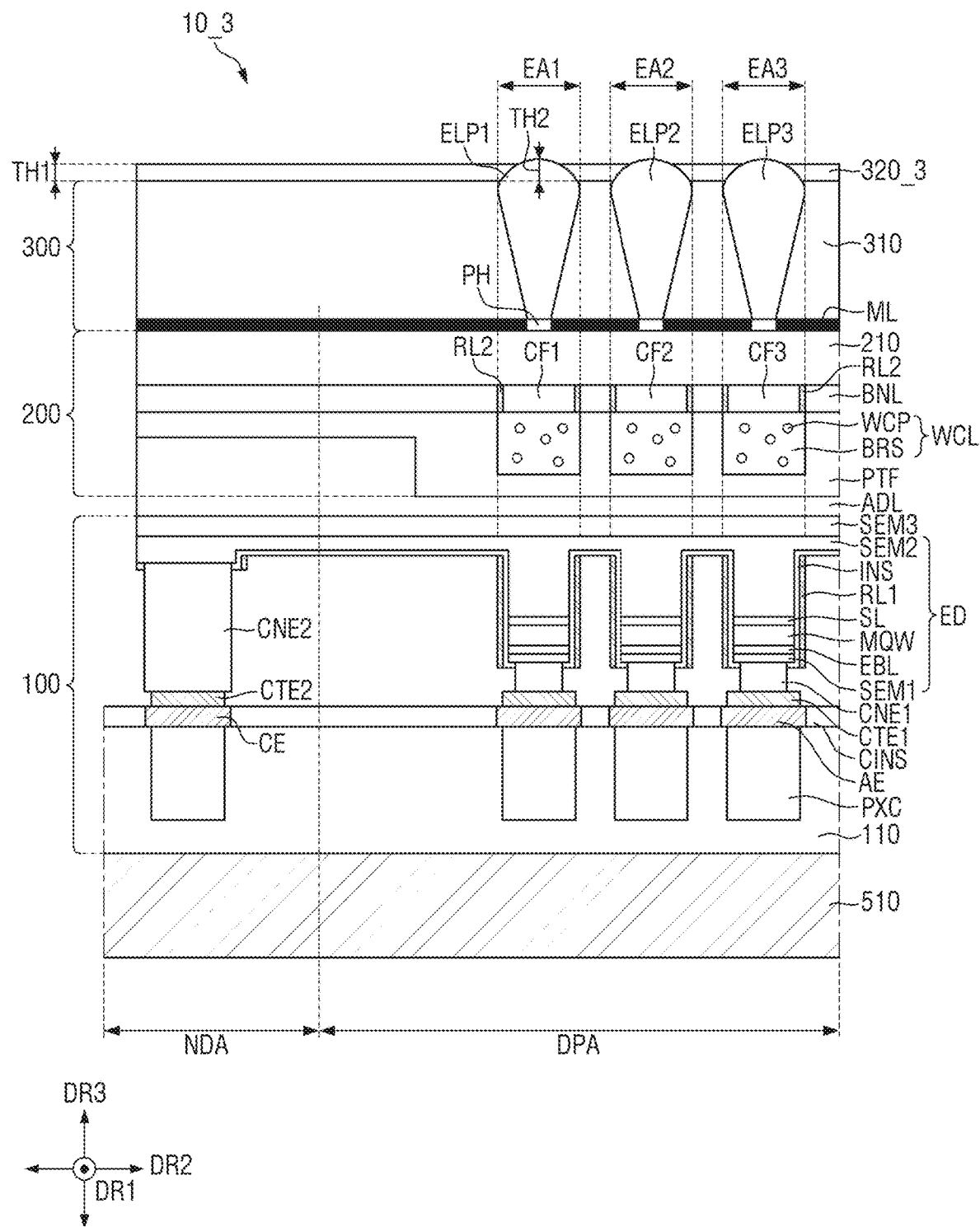
FIG. 25 is a cross-sectional view of a part of a display device according to one or more embodiments.

FIG. 25 is a cross-sectional view of a part of a display device 10_3 according to one or more embodiments.

Referring to FIG. 25, in the display device 10_3 according to one or more embodiments, a thickness TH1 of a capping layer 320_3 of a light exit substrate 300 may be smaller than a thickness TH2 of a second part P2 of each light exit pattern ELP. The capping layer 320_3 may cover only a part of each light exit pattern ELP, and most light may be emitted from a part of the second part P2 of the light exit pattern ELP which protrudes from an upper surface of the capping layer 320_3. Accordingly, the upward light emission efficiency of the display device 10_3 can be further improved.

Figure 26:
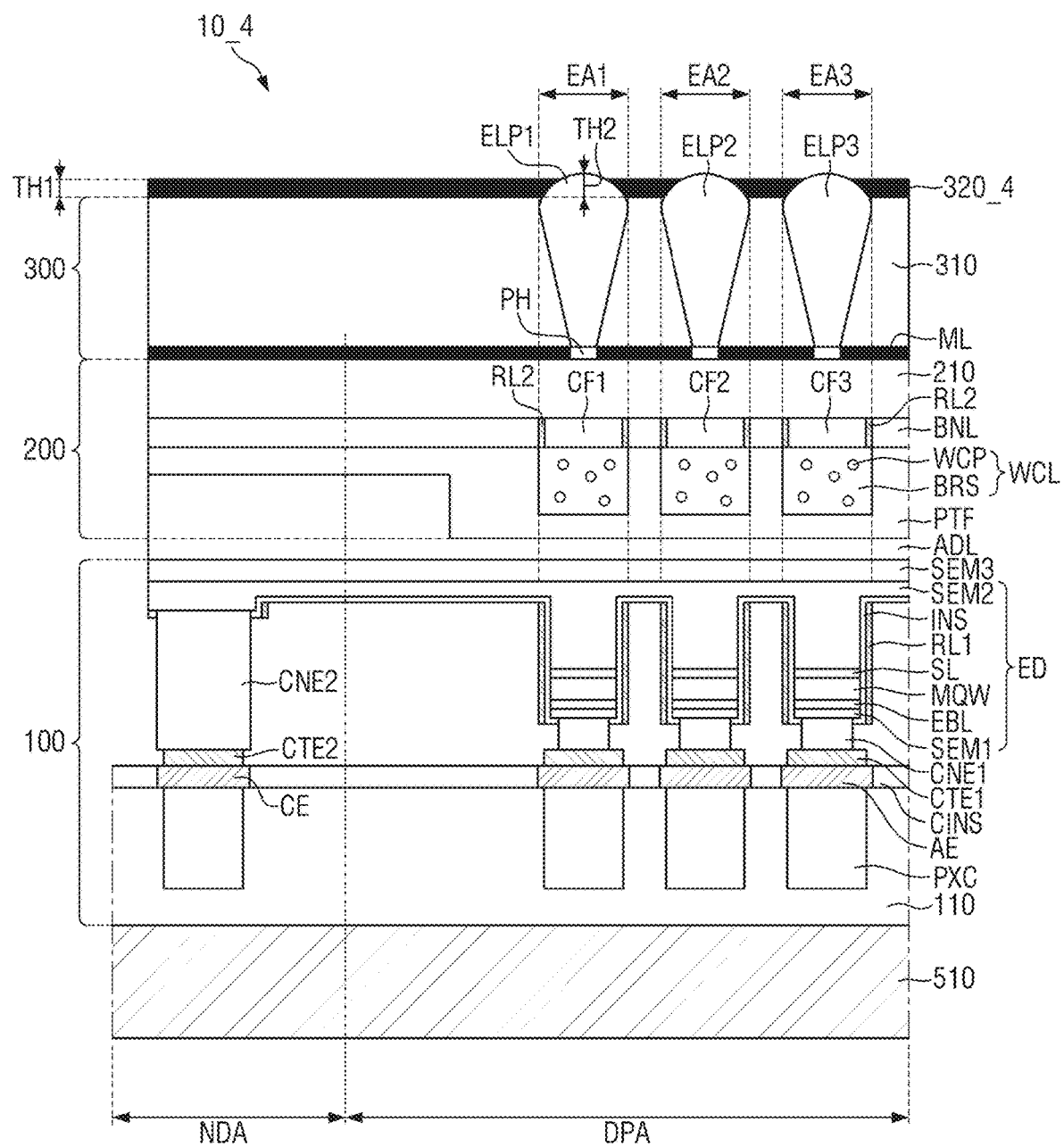
FIG. 26 is a cross-sectional view of a part of a display device according to one or more embodiments.

FIG. 26 is a cross-sectional view of a part of a display device 10_4 according to an embodiment.

Referring to FIG. 26, in the display device 10_4 according to one or more embodiments, a capping layer 320_4 may include a material that blocks transmission of light. A thickness TH1 of the capping layer 320_4 may be smaller than a thickness TH2 of a second part P2 of each light exit pattern ELP. Even though the material of the capping layer 320_4 blocks transmission of light, light may be emitted from a part of the second part P2 which is not covered by the capping layer 320_4.

The capping layer 320_4 may include an organic material as a material that blocks transmission of light. The capping layer 320_4 may be entirely disposed on a third substrate 310 but may partially expose upper surfaces of the light exit patterns ELP. Accordingly, the capping layer 320_4 may be disposed between the light exit patterns ELP or between emission areas EA1 through EA3. Because the capping layer 320_4 includes a material that blocks transmission of light, it may block transmission of light emitted between the emission areas EA1 through EA3, thereby preventing color mixing between neighboring emission areas EA1 through EA3. In addition, the capping layer 320_4 may reduce color distortion due to reflection of external light by absorbing the external light. In one or more embodiments, the capping layer 320_4 may be made of a material used as a black matrix.

Figure 27:
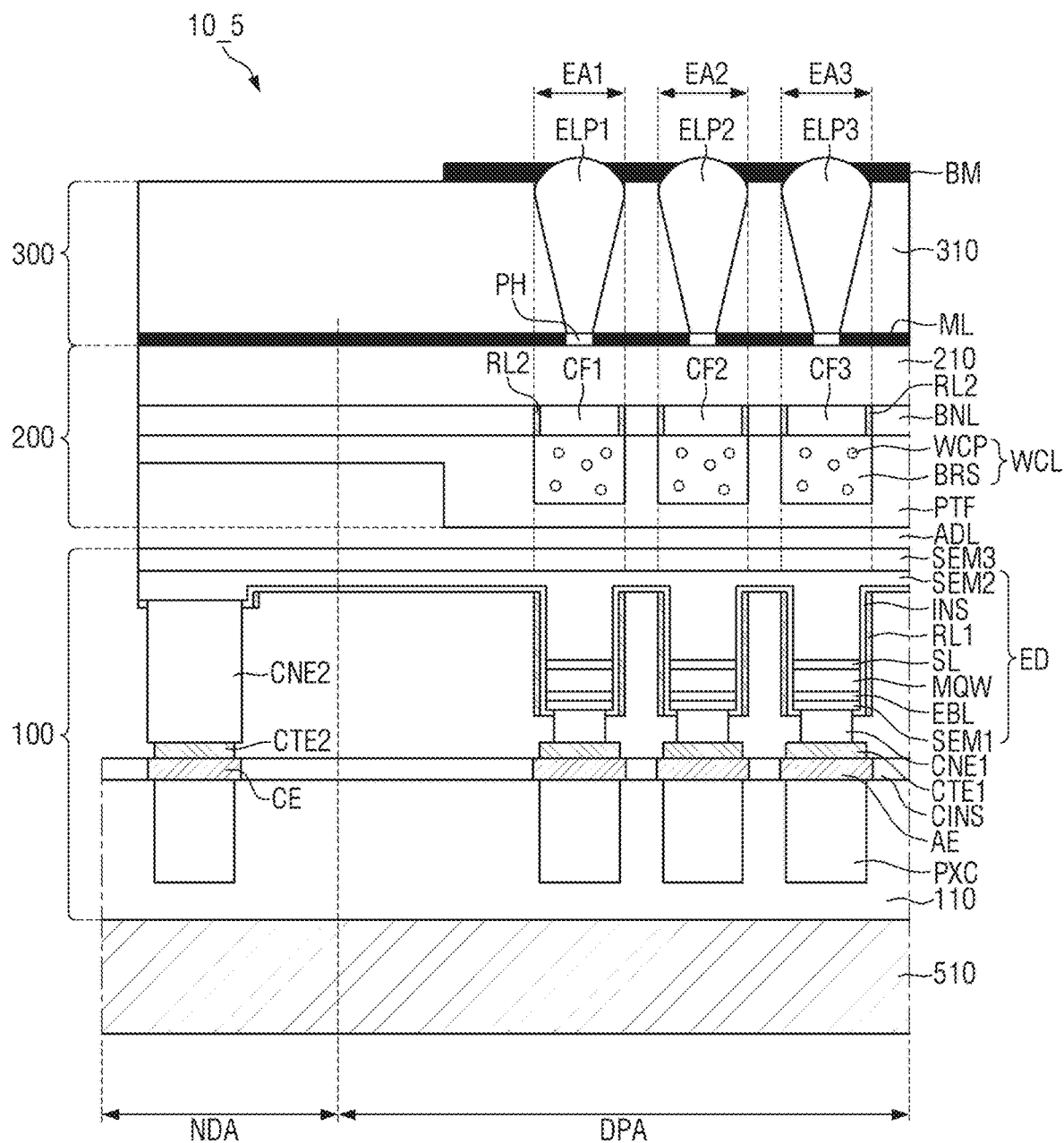
FIG. 27 is a cross-sectional view of a part of a display device according to an one or more embodiments.

FIG. 27 is a cross-sectional view of a part of a display device 10_5 according to one or more embodiments.

Referring to FIG. 27, in the display device 10_5 according to one or more embodiments, a light exit substrate 300 may include a light blocking member BM. The light blocking member BM may be disposed in a display area DPA in which light exit patterns ELP of the light exit substrate 300 are disposed and may be formed in a pattern similar to a bank layer BNL of a color conversion substrate 200.

For example, the light blocking member BM may extend in the first direction DR1 and the second direction DR2 to be around (e.g., surround) the light exit patterns ELP in a plan view. Similarly to the capping layer 320_4 in the embodiment of FIG. 26, the light blocking member BM may include a material that blocks transmission of light to prevent color mixing between adjacent emission areas EA1 through EA3. Alternatively, in one or more embodiments, the light blocking member BM may be replaced with a material that absorbs light of a specific wavelength from among visible light wavelengths and transmits light of another specific wavelength. The light blocking member BM may be replaced with a color pattern that includes the same material as at least any one of first through third color filters CF1 through CF3. For example, in an area in which the light blocking member BM is disposed, a color pattern including the material of any one of the color filters CF1 through CF3 may be disposed, or a plurality of color patterns may be stacked. Accordingly, the light blocking member BM may prevent color mixing between neighboring emission areas EA1 through EA3 and reduce reflected light due to external light depending on the material of the light blocking member BM.

Figure 28:
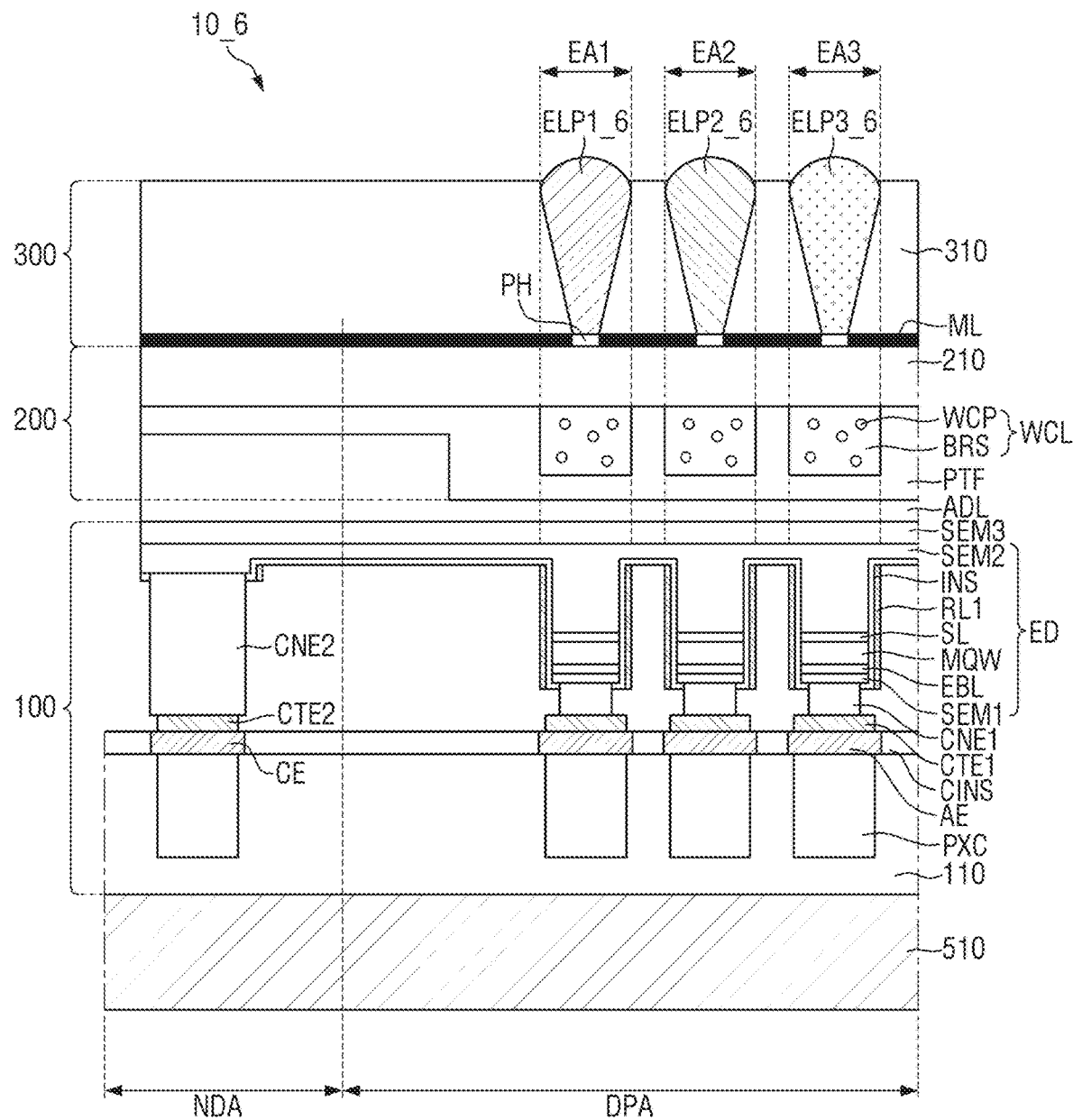
FIG. 28 is a cross-sectional view of a part of a display device according to one or more embodiments.

FIG. 28 is a cross-sectional view of a part of a display device 10_6 according to an embodiment.

Referring to FIG. 28, in the display device 10_6 according to one or more embodiments, color filters CF1 through CF3, and a bank layer BNL of a color conversion substrate 200 may be omitted, and each of light exit patterns ELP1_6 through ELP3_6 may be made of a material that includes the same colorant as a color filter. In the display device 10_6 according to the current embodiment, the light exit patterns ELP1_6 through ELP3_6 not only guide upward emission of light emitted from light emitting elements ED but also selectively transmit the light to replace the color filters CF1 through CF3.

As described above, each of the light exit patterns ELP1_6 through ELP3_6 may be made of an organic material having a greater refractive index than a third substrate 310 and may transmit only light of a specific color if further including a colorant. For example, a first light exit pattern ELP1_6 disposed in a first emission area EA1 may be a red color filter like a first color filter CF1. A second light exit pattern ELP2_6 disposed in a second emission area EA2 may be a green color filter like a second color filter CF2, and a third light exit pattern ELP3_6 disposed in a third emission area EA3 may be a blue color filter like a third color filter CF3. Because the color filters CF1 through CF3 and the bank layer BNL are omitted from the color conversion substrate 200, color control structures WCL may be directly disposed on a surface of a second substrate 210. In the display device 10_6, a manufacturing process of the color conversion substrate 200 may be reduced, and a thickness of the color conversion substrate 200 may be reduced.

Figure 29:
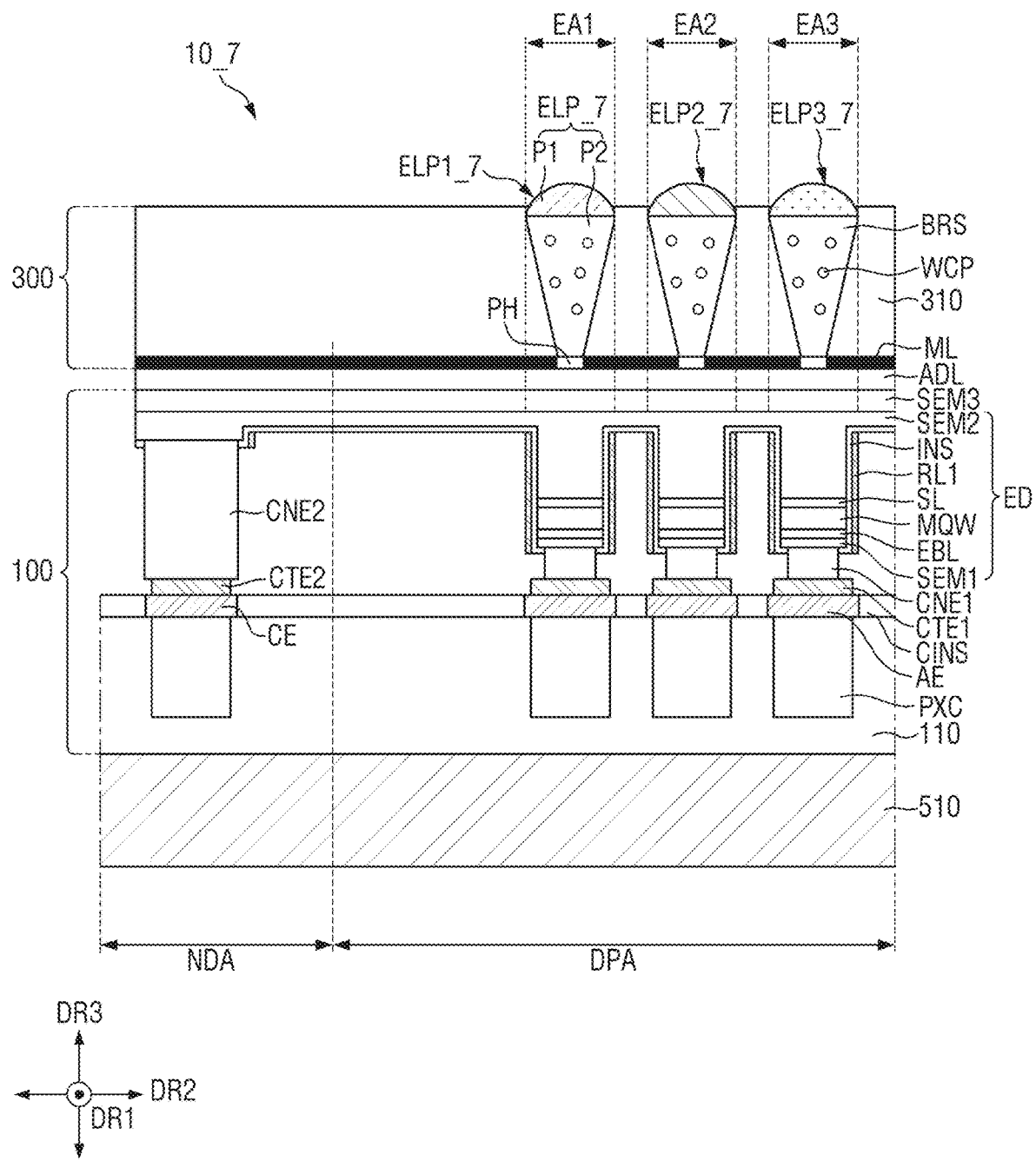
FIG. 29 is a cross-sectional view of a part of a display device according to one or more embodiments.

FIG. 29 is a cross-sectional view of a part of a display device 10_7 according to one or more embodiments.

Referring to FIG. 29, in the display device 10_7 according to one or more embodiments, a color conversion substrate 200 may be omitted, and light exit patterns ELP_7 may replace color filters CF1 through CF3 and color control structures WCL. In each of the light exit patterns ELP_7, a first part P1 may include wavelength conversion particles WCP, and a second part P2, like a color filter, may include a colorant such as a dye or pigment that absorbs light in a specific wavelength band. As in the embodiment of FIG. 24, each of the light exit patterns ELP_7 may include the first part P1 and the second part P2 having different materials, and each of the first part P1 and the second part P2 may control the wavelength band of emitted light.

Light emitted from light emitting elements ED may enter the light exit patterns ELP_7 through holes PH, and then its wavelength may be converted by the wavelength conversion particles WCP. In one or more embodiments in which the light emitting elements ED emit light of the third color, light emitted from the light emitting elements ED may be converted into yellow light by the wavelength conversion particles WCP in the first part P1 of each of the light exit patterns ELP_7. In addition, in the first part P1 of each of the light exit patterns ELP_7, the light may be guided toward the second part P2.

Among the light incident on the second part P2, only light in a specific wavelength band may be transmitted through the second part P2 of each of the light exit patterns ELP_7 depending on the colorant included in the second part P2. The second part P2 may include a red colorant in a first light exit pattern ELP1_7, include a green colorant in a second light exit pattern ELP2_7, and include a blue colorant in a third light exit pattern ELP3_7. In each of the light exit patterns ELP1_7 through ELP3_7 different from each other, the second part P2 may function as a color filter.

Although an adhesive layer ADL is disposed between a light exit substrate 300 and a display substrate 100 in the drawing, the present disclosure is not limited thereto. A hole mask layer ML of the light exit substrate 300 may also be directly disposed on a third semiconductor layer SEM3 of the display substrate 100.

In the display device 10_7 according to the current embodiment, each of the light exit patterns ELP_7 may control the color of emitted light in addition to controlling the emission direction of the light. Also, because the color conversion substrate 200 is omitted, the overall thickness of the display device 10_7 may be further reduced.

Figure 30:
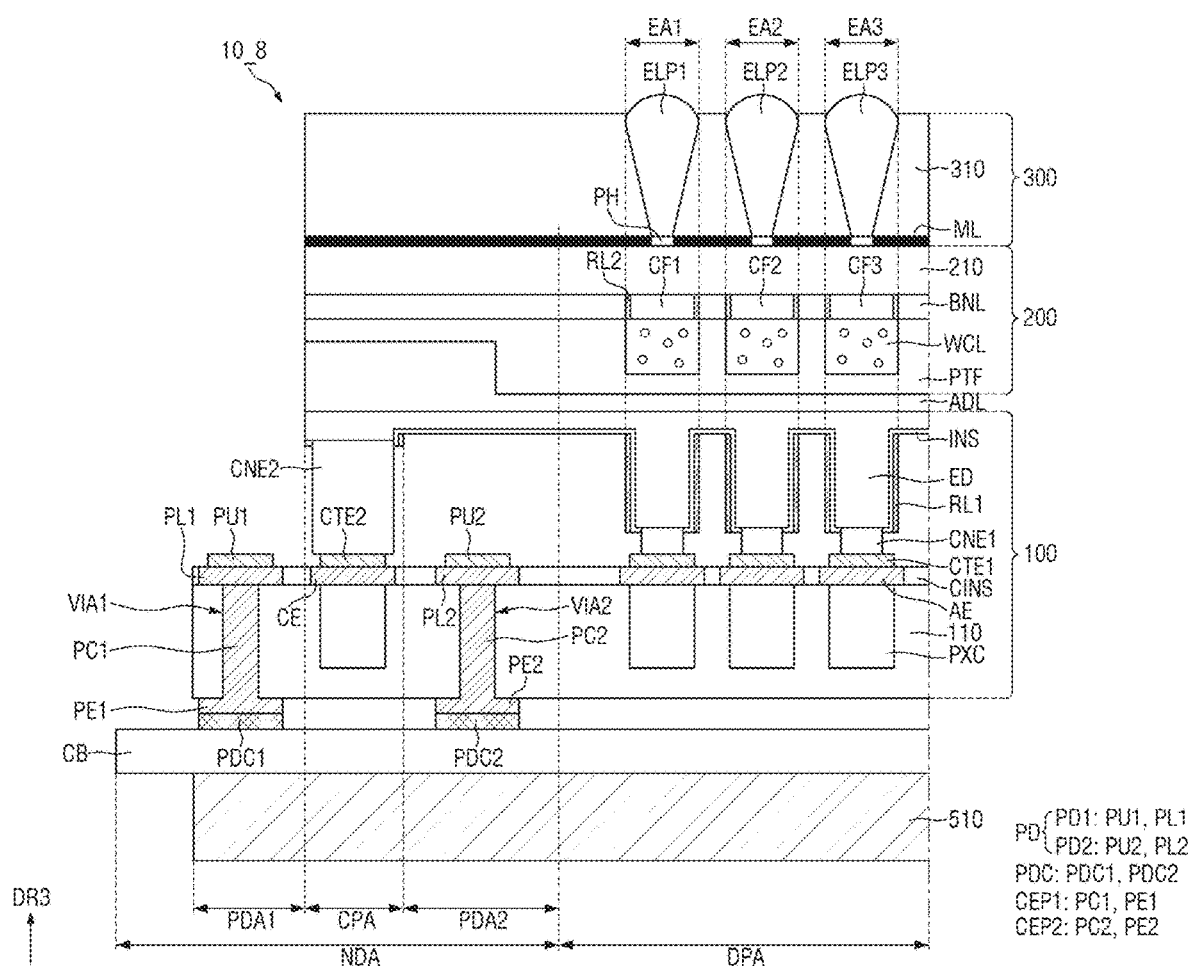
FIG. 30 is a cross-sectional view of a part of a display device according to one or more embodiments.

FIG. 30 is a cross-sectional view of a part of a display device 10_8 according to one or more embodiments.

Referring to FIG. 30, in the display device 10_8 according to the illustrated embodiment, a circuit board CB may be disposed under a first substrate 110, and a plurality of pads PD (e.g., PD1 and PD2) of a non-display area NDA may be electrically connected to circuit board pads PDC1 and PDC2 of the circuit board CB through via holes VIA1 and VIA2 passing through the first substrate 110. The current embodiment is different from the embodiment of FIG. 4 in the electrical connection method of the pads PD and the circuit board pads PDC1 and PDC2 and the arrangement of pad areas PDA1 and PDA2.

The display device 10_8 may include, as the pad areas PDA (e.g., PDA1 and PDA2) disposed in the non-display area NDA, a first pad area PDA1 disposed outside a common electrode connection part CPA and a second pad area PDA2 disposed inside the common electrode connection part CPA. Based on the common electrode connection part CPA, the first pad area PDA1 may be an outer pad area, and the second pad area PDA2 may be an inner pad area. The pads PD (e.g., PD1 and PD2) may be disposed in the first pad area PDA1 and the second pad area PDA2, respectively. First pads PD1 and second pads PD2 may be disposed outside and inside common electrodes CE, respectively. Each of the first pads PD1 may include a first pad base layer PL1 and a first pad upper layer PU1, and each of the second pads PD2 may include a second pad base layer PL2 and a second pad upper layer PU2. The structure of each pad PD is the same as that described above.

In the display device 10_8, it is necessary to secure a space in which the common electrode connection part CPA and the pad areas PDA are disposed in the non-display area NDA. In order to realize an ultra-high resolution display device by placing a large number of light emitting elements ED per unit area, designing the display device 10_8 to reduce or minimize the non-display area NDA may be considered.

In the display device 10_8 according to the illustrated embodiment, the circuit board CB may be disposed under the first substrate 110, the pads PD may be electrically connected to the circuit board pads PDC through the via holes VIA (e.g., VIA1 and VIA2) passing through the first substrate 110, and some of the pads PD may be disposed inside the common electrode connection part CPA. The pads PD may be disposed inside and outside the common electrode connection part CPA in the non-display area NDA, and the space of the area outside the common electrode connection part CPA may be reduced or minimized. In the display device 10_8, the area outside the common electrode connection part CPA in the non-display area NDA of the first substrate 110 may be reduced or minimized, and the display area DPA may occupy a relatively large area. In the display device 10_8 according to the illustrated embodiment, because the pads PD are electrically connected to the circuit board pads PDC of the circuit board CB through the via holes VIA (VIA1 and VIA2) passing through the first substrate 110, a sufficient display area DPA can be secured, which is suitable for realizing an ultra-high resolution display device.

The pads PD (e.g., PD1 and PD2) may be respectively electrically connected to the circuit board pads PDC (e.g., PDC1 and PDC2) of the circuit board CB through the via holes VIA (e.g., VIA1 and VIA2) and pad connection electrodes CEP (e.g., CEP1 and CEP2) formed in the first substrate 110. The pads PD1 and PD2 may be disposed on a first surface of the first substrate 110, and the circuit board pads PDC1 and PDC2 may be disposed on a surface of the circuit board CB. According to one or more embodiments, the via holes VIA (e.g., VIA1 and VIA2) include first via holes VIA1 formed in the first pad area PDA1 of the non-display area NDA and second via holes VIA2 formed in the second pad area PDA2. The pad connection electrodes CEP may include first pad connection electrodes CEP1 electrically connecting the first pads PD1 and the first circuit board pads PDC1 and second pad connection electrodes CEP2 electrically connecting the second pads PD2 and the second circuit board pads PDC2.

The first via holes VIA1 may be formed to respectively correspond to the first pads PD1 in the first pad area PDA1 and may pass through the first substrate 110. The first via holes VIA1 may pass through the first substrate 110 from the first surface on which the first pads PD1 are disposed to a second surface. The first via holes VIA1 may overlap the first pads PD1, and the first pad base layers PL1 may be disposed on the first via holes VIA1. The first pad connection electrodes CEP1 may be partially disposed in the first via holes VIA1 and may be electrically connected to the first pads PD1 and the first circuit board pads PDC1, respectively. Each of the first pad connection electrodes CEP1 may include a first connection part PC1 disposed in a first via hole VIA1 and a first electrode part PE1 connected to the first connection part PC1 and disposed on a lower surface of the first substrate 110. The first connection part PC1 may directly contact the first pad base layer PL1 of a first pad PD1, and the first electrode part PE1 may be disposed on the second surface of the first substrate 110 to directly contact a first circuit board pad PDC1.

The second via holes VIA2 may be formed to respectively correspond to the second pads PD2 in the second pad area PDA2 and may pass through the first substrate 110. The second via holes VIA2 may pass through the first substrate 110 from the first surface on which the second pads PD2 are disposed to the second surface. The second via holes VIA2 may overlap the second pads PD2, and the second pad base layers PL2 may be disposed on the second via holes VIA2. The second pad connection electrodes CEP2 may be partially disposed in the second via holes VIA2 and may be electrically connected to the second pads PD2 and the second circuit board pads PDC2, respectively. Each of the second pad connection electrodes CEP2 may include a second connection part PC2 disposed in a second via hole VIA2 and a second electrode part PE2 connected to the second connection part PC2 and disposed on the lower surface of the first substrate 110. The second connection part PC2 may directly contact the second pad base layer PL2 of a second pad PD2, and the second electrode part PE2 may be disposed on the second surface of the first substrate 110 to directly contact a second circuit board pad PDC2.

The via holes VIA1 and VIA2 formed in the first substrate 110 may provide paths through which the pads PD1 and PD2 disposed on the first substrate 110 can be electrically connected to the circuit board pads PDC through the pad connection electrodes CEP, respectively. The first via holes VIA1 may be disposed in the first pad area PDA1 to correspond to the first pads PD1, and the planar arrangement of the first via holes VIA1 may be substantially the same as the planar arrangement of the first pads PD1. The second via holes VIA2 may be disposed in the second pad area PDA2 to correspond to the second pads PD2, and the planar arrangement of the second via holes VIA2 may be substantially the same as the planar arrangement of the second pads PD2.

The pad connection electrodes CEP and the circuit board pads PDC may not necessarily completely correspond to the arrangement of the pads PD disposed on the first substrate 110. In the drawing, the first pad connection electrodes CEP1 and the first circuit board pads PDC1 are disposed to correspond to the first pads PD1 and the first via holes VIA1, respectively, and the second pad connection electrodes CEP2 and the second circuit board pads PDC2 are disposed to correspond to the second pads PD2 and the second via holes VIA2, respectively. However, the present disclosure is not limited thereto, and the pads PD1 and PD2 may also not correspond to the circuit board pads PDC1 and PDC2, respectively, and the circuit board pads PDC1 and PDC2 may be disposed to correspond to only some of the pads PD1 and PD2. In the pad connection electrodes CEP1 and CEP2, since because the connection parts PC1 and PC2 disposed in the via holes VIA1 and VIA2 correspond to the via holes VIA1 and VIA2, respectively, they may be disposed to correspond to the pads PD disposed on the first substrate 110, respectively. Because the electrode parts PE1 and PE2 contact the circuit board pads PDC1 and PDC2, they may be disposed to correspond to the circuit board pads PDC1 and PDC2. The pad connection electrodes CEP and the circuit board pads PDC1 and PDC2 may be variously changed according to the design of the pads PD and the structure of the first substrate 110.

Figure 31:
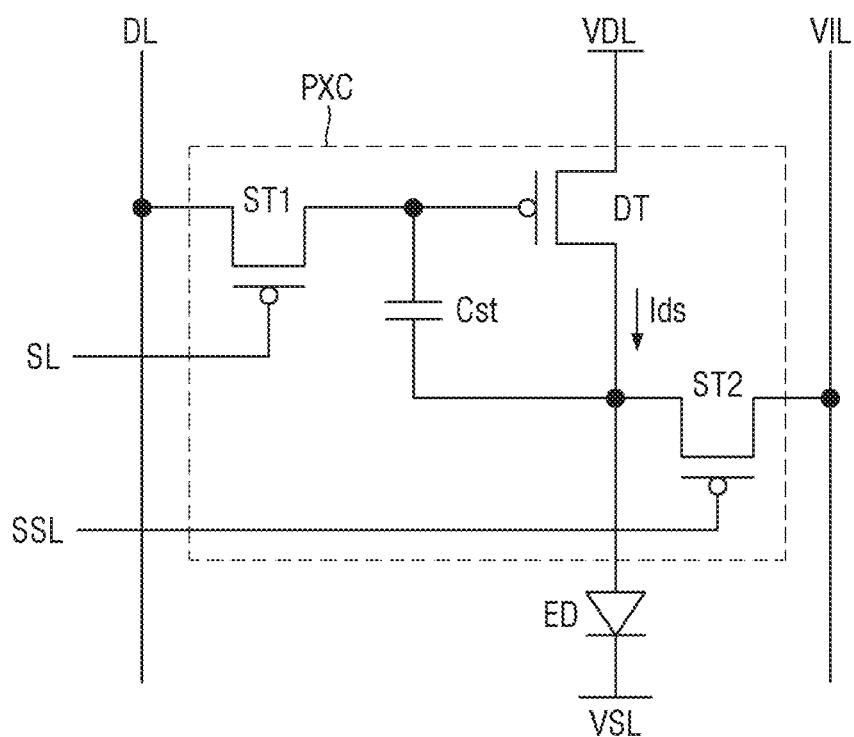
FIG. 31 is a circuit diagram of a pixel circuit unit and a light emitting element according to one or more embodiments.

FIG. 31 is a circuit diagram of a pixel circuit unit PXC and a light emitting element ED according to one or more embodiments. FIG. 31 illustrates an example of a pixel circuit unit PXC and a light emitting element ED of FIG. 4.

Referring to FIG. 31, the light emitting element ED emits light according to a driving current Ids. The amount of light emitted from the light emitting element ED may be proportional to the driving current Ids. The light emitting element ED may be an inorganic light emitting element including an anode, a cathode, and an inorganic semiconductor disposed between the anode and the cathode.

The anode of the light emitting element ED may be connected to a source electrode of a driving transistor DT, and the cathode may be connected to a second power line VSL to which a low-potential voltage lower than a high-potential voltage is supplied.

The driving transistor DT adjusts a current flowing from a first power line VDL, to which a first power supply voltage is supplied, to the light emitting element ED according to a voltage difference between a gate electrode and the source electrode. The driving transistor DT may have the gate electrode connected to a first electrode of a first transistor ST1, the source electrode connected to the anode of the light emitting element ED, and a drain electrode connected to the first power line VDL to which a high-potential voltage is applied.

The first transistor ST1 is turned on by a scan signal of a scan line SL to connect a data line DL to the gate electrode of the driving transistor DT. The first transistor ST1 may have a gate electrode connected to the scan line SL, the first electrode connected to the gate electrode of the driving transistor DT, and a second electrode connected to the data line DL.

A second transistor ST2 is turned on by a sensing signal of a sensing signal line SSL to connect an initialization voltage line VIL to the source electrode of the driving transistor DT. The second transistor ST2 may have a gate electrode connected to the sensing signal line SSL, a first electrode connected to the initialization voltage line VIL, and a second electrode connected to the source electrode of the driving transistor DT.

The first electrode of each of the first and second transistors ST1 and ST2 may be a source electrode, and the second electrode may be a drain electrode. However, the present disclosure is not limited thereto. That is, the first electrode of each of the first and second transistors ST1 and ST2 may also be a drain electrode, and the second electrode may be a source electrode.

A capacitor Cst is formed between the gate electrode and the source electrode of the driving transistor DT. The capacitor Cst stores a difference voltage between a gate voltage and a source voltage of the driving transistor DT.

Although a case where the driving transistor DT and the first and second transistors ST1 and ST2 are formed as P-type metal oxide semiconductor field effect transistors (MOSFETs) has been mainly described in FIG. 31, it should be noted that the present disclosure is not limited thereto. The driving transistor DT and the first and second transistors ST1 and ST2 may also be formed as N-type MOSFETs.

Figure 32:
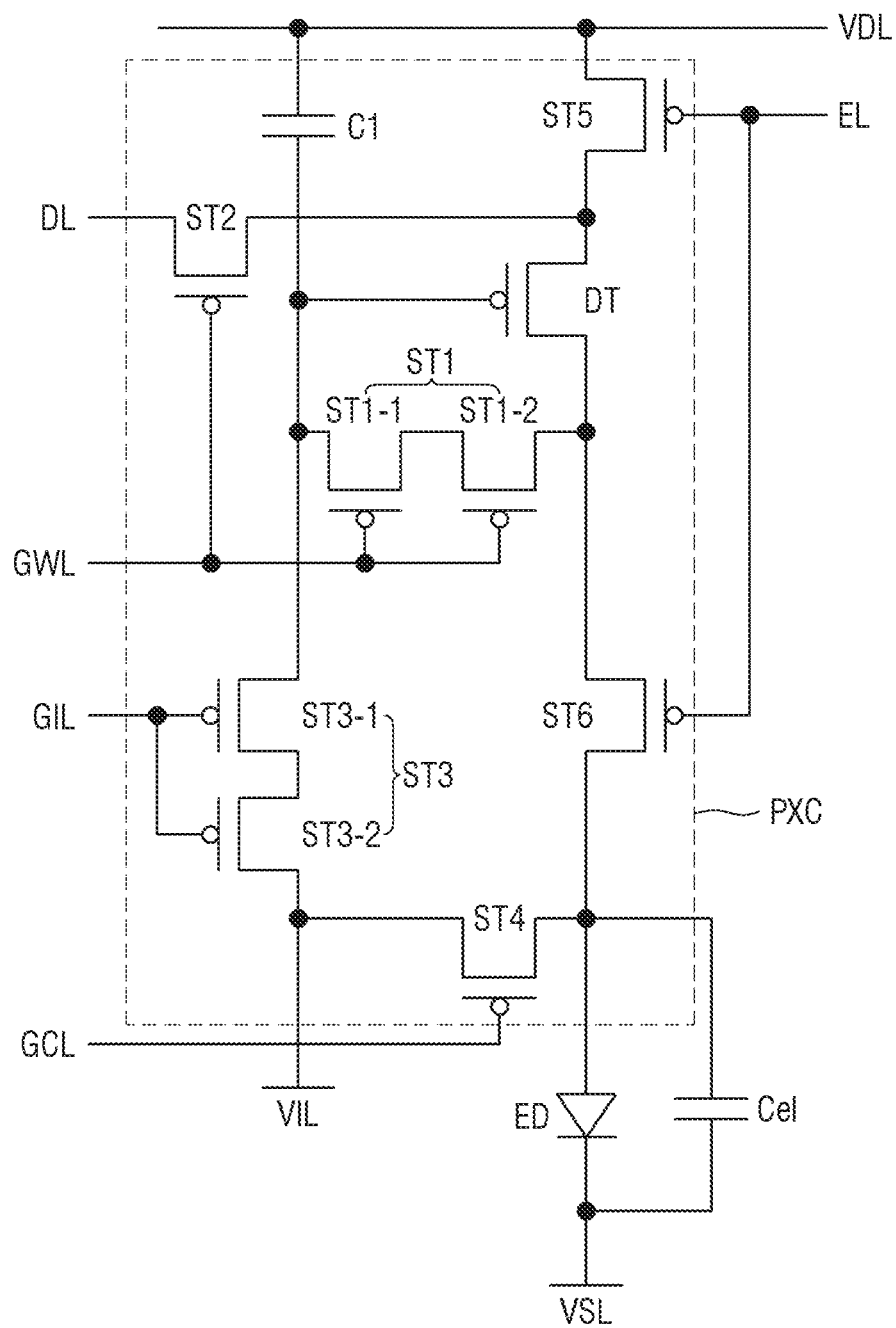
FIG. 32 is a circuit diagram of a pixel circuit unit and a light emitting element according to one or more embodiments.

FIG. 32 is a circuit diagram of a pixel circuit unit PXC and a light emitting element ED according to one or more embodiments. FIG. 32 illustrates an example of a pixel circuit unit PXC and a light emitting element ED of FIG. 4.

Referring to FIG. 32, the light emitting element ED emits light according to a driving current Ids. The amount of light emitted from the light emitting element ED may be proportional to the driving current Ids. The light emitting element ED may be an inorganic light emitting element including an anode, a cathode, and an inorganic semiconductor disposed between the anode and the cathode.

The anode of the light emitting element ED may be connected to a first electrode of a fourth transistor ST4 and a second electrode of a sixth transistor ST6, and the cathode may be connected to a second power line VSL. A parasitic capacitance Cel may be formed between the anode and the cathode of the light emitting element ED.

The pixel circuit unit PXC includes a driving transistor DT, switch elements, and a capacitor C1. The switch elements include first through sixth transistors ST1 through ST6.

The driving transistor DT includes a gate electrode, a first electrode, and a second electrode. The driving transistor DT controls the driving current Ids, which is a drain-source current flowing between the first electrode and the second electrode, according to a data voltage applied to the gate electrode.

The capacitor C1 is formed between the gate electrode of the driving transistor DT and a first power line VDL. An electrode of the capacitor C1 may be connected to the gate electrode of the driving transistor DT, and the other electrode may be connected to the first power line VDL.

When a first electrode of each of the first through sixth transistors ST1 through ST6 and the driving transistor DT is a source electrode, a second electrode may be a drain electrode. Alternatively, when the first electrode of each of the first through sixth transistors ST1 through ST6 and the driving transistor DT is a drain electrode, the second electrode may be a source electrode, An active layer of each of the first through sixth transistors ST1 through ST6 and the driving transistor DT may be made of any one of polysilicon, amorphous silicon, and an oxide semiconductor. When a semiconductor layer of each of the first through sixth transistors ST1 through ST6 and the driving transistor DT is made of polysilicon, a process for forming the semiconductor layer may be a low-temperature polysilicon (LTPS) process.

In addition, although a case where the first through sixth transistors ST1 through ST6 and the driving transistor DT are formed as P-type MOSFETs has been mainly described in FIG. 32, the present disclosure is not limited thereto. The first through sixth transistors ST1 through ST6 and the driving transistor DT may also be formed as N-type MOSFETs.

Further, a second power supply voltage of the second power line VSL, a first power supply voltage of the first power line VDL, and a third power supply voltage of a third power line VIL may be set in consideration of characteristics of the driving transistor DT, characteristics of the light emitting element ED, and the like.

Figure 33:
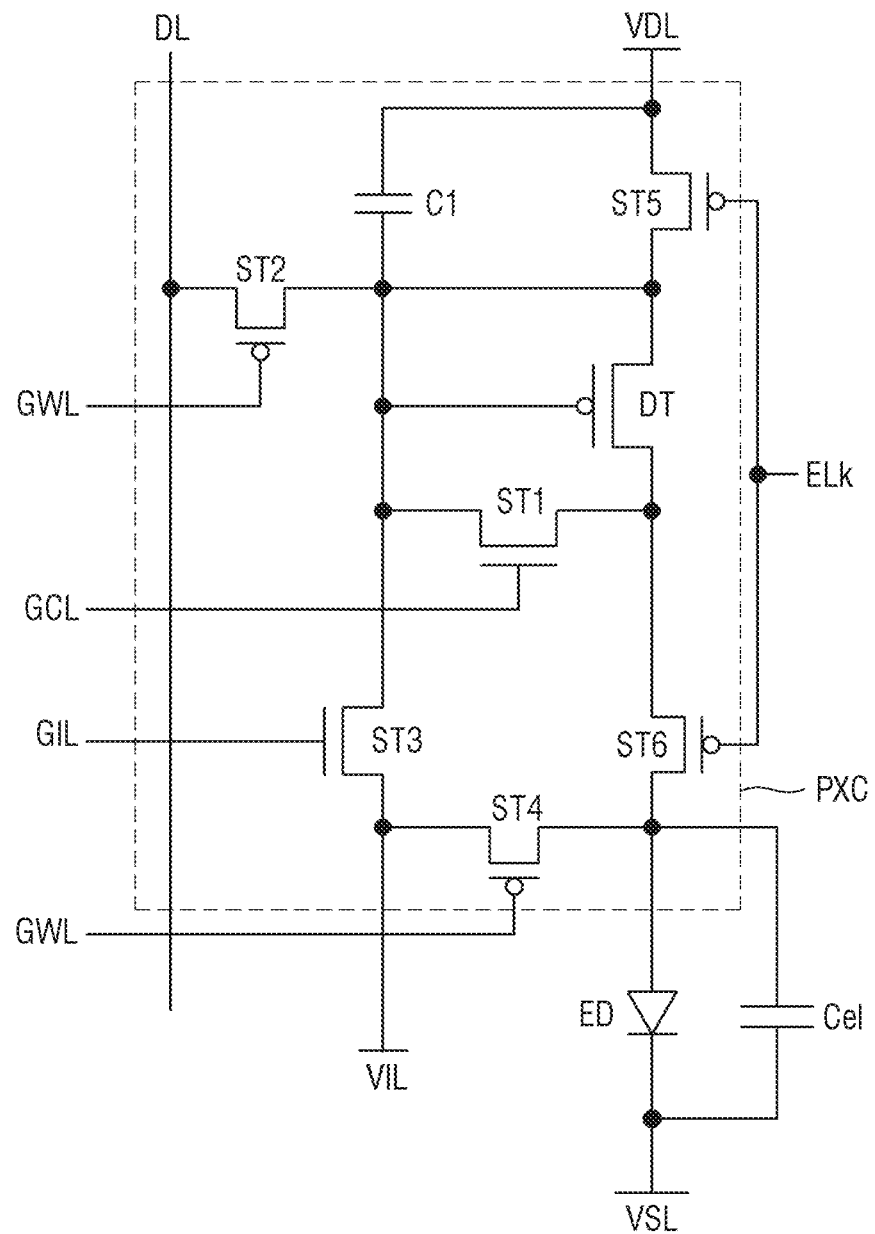
FIG. 33 is a circuit diagram of a pixel circuit unit and a light emitting element according to one or more embodiments.

FIG. 33 is a circuit diagram of a pixel circuit unit PXC and a light emitting element ED according to one or more embodiments. FIG. 33 illustrates an example of a pixel circuit unit PXC and a light emitting element ED of FIG. 4.

The embodiment of FIG. 33 is different from the embodiment of FIG. 32 in that a driving transistor DT, a second transistor ST2, a fourth transistor ST4, a fifth transistor ST5, and a sixth transistor ST6 are formed as P-type MOSFETs, and a first transistor ST1 and a third transistor ST3 are formed as N-type MOSFETs.

Referring to FIG. 33, an active layer of each of the driving transistor DT, the second transistor ST2, the fourth transistor ST4, the fifth transistor ST5, and the sixth transistor ST6 formed as P-type MOSFETs may be made of polysilicon, and an active layer of each of the first transistor ST1 and the third transistor ST3 formed as N-type MOSFETs may be made of an oxide semiconductor.

The embodiment of FIG. 33 is different from the embodiment of FIG. 32 in that a gate electrode of the second transistor ST2 and a gate electrode of the fourth transistor ST4 are connected to write scan lines GWL, and a gate electrode of the first transistor ST1 is connected to a control scan line GCL. In addition, because the first transistor ST1 and the third transistor ST3 are formed as N-type MOSFETs in FIG. 33, a scan signal of a gate-high voltage may be transmitted to the control scan line GCL and an initialization scan line GIL. In contrast, because the second transistor ST2, the fourth transistor ST4, the fifth transistor ST5, and the sixth transistor ST6 are formed as P-type MOSFETs, a scan signal of a gate-low voltage may be transmitted to the write scan lines GWL and an emission line EL.

The pixel circuit unit PXC according to the present disclosure is not limited to those illustrated in FIGS. 31-33. The pixel circuit unit PXC may also be formed in a circuit structure other than the embodiments illustrated in FIGS. 31-33. A display device for displaying an image according to one or more embodiments may be applied to various devices and apparatuses.

Figure 34:
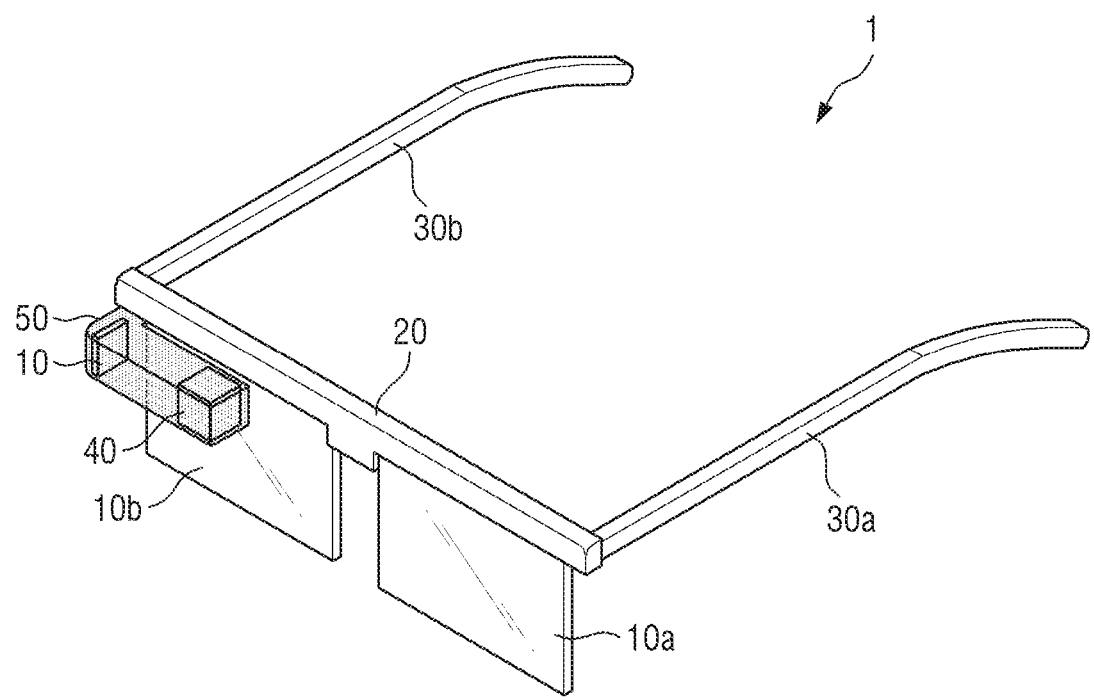
FIGS. 34-36 are schematic views of devices including a display device according to one or more embodiments.
Figure 35:
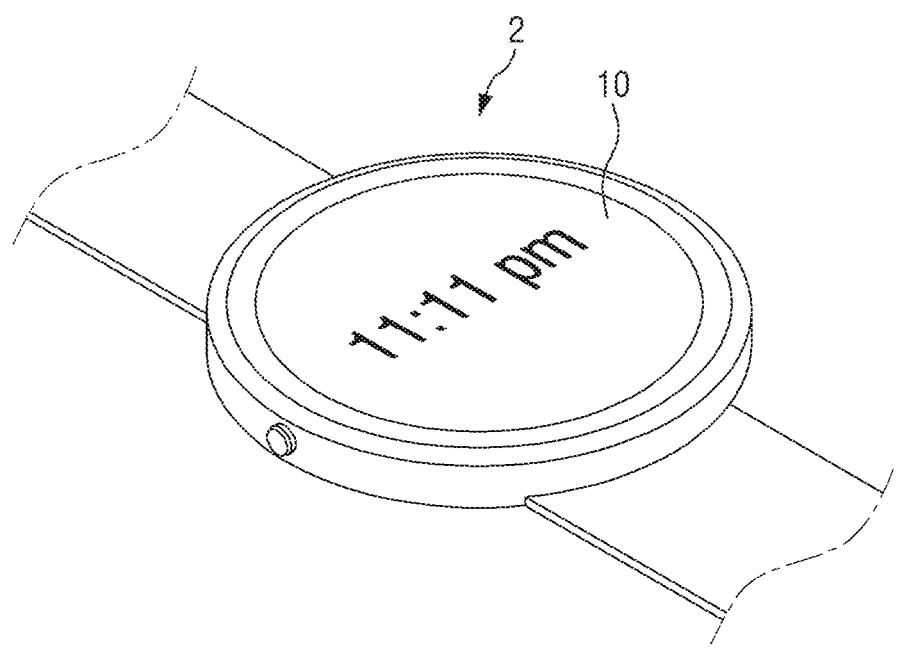
Figure 36:
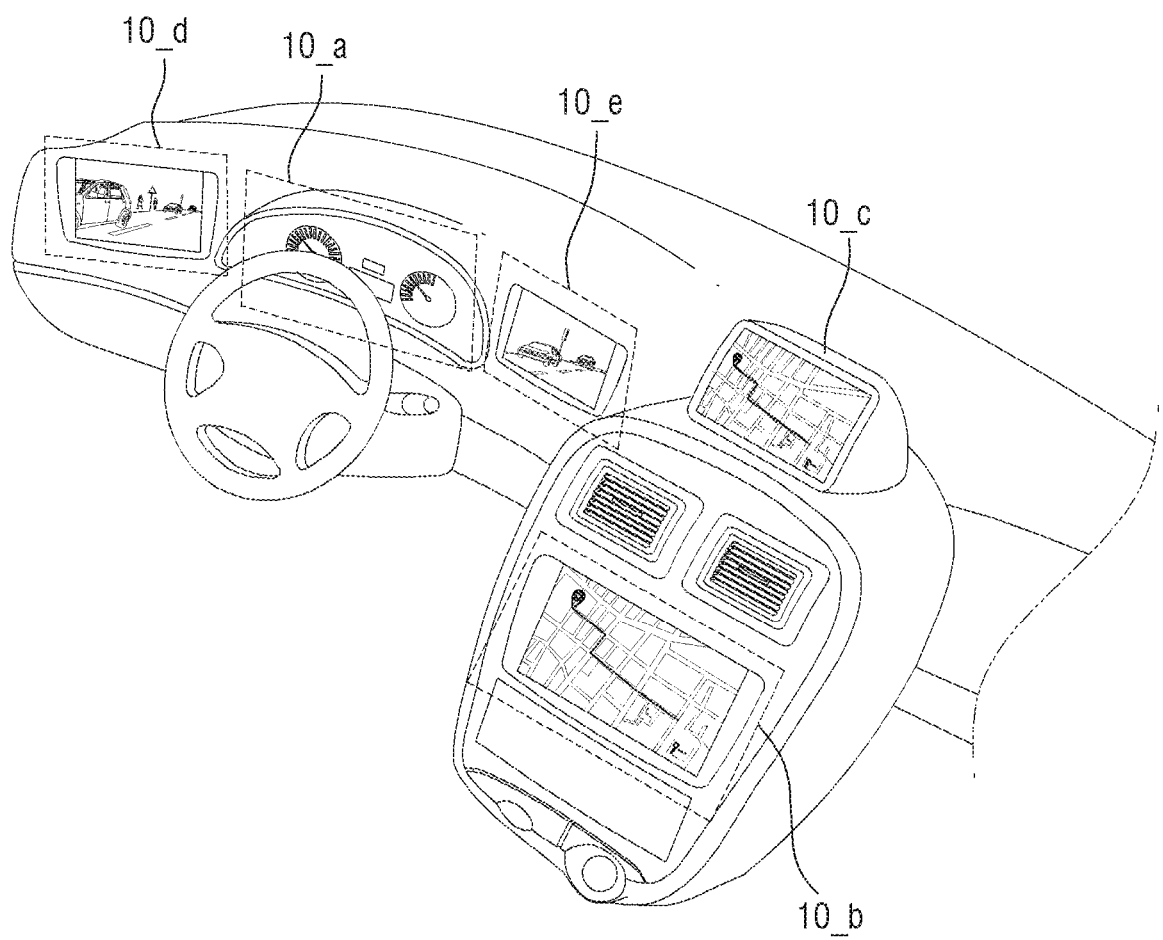

FIGS. 34-36 are schematic views of devices including a display device according to one or more embodiments. FIG. 34 illustrates a virtual reality (VR) device 1 to which a display device 10 according to one or more embodiments is applied, and FIG. 35 illustrates a smart watch 2 to which a display device 10 according to one or more embodiments is applied. FIG. 36 illustrates display units of a vehicle to which display devices 10_a through 10_e according to one or more embodiments are applied.

Referring to FIG. 34, a VR device 1 according to one or more embodiments may be a device in the form of glasses. The VR device 1 according to the current embodiment may include a display device 10, a left lens 10a, a right lens 10b, a support frame 20, eyeglass frame legs 30a and 30b, a reflective member 40, and a display device accommodating unit 50.

In FIG. 34, the VR device 1 including the eyeglass frame legs 30a and 30b is illustrated as an example. However, the VR device 1 according to the illustrated embodiment may also be applied to a head-mounted display including a head-mounted band, which can be mounted on the head, instead of the eyeglass frame legs 30a and 30b. The VR device 1 according to the illustrated embodiment is not limited to the structure illustrated in the drawing and can be applied in various forms in various other electronic devices.

The display device accommodating unit 50 may include the display device 10 and the reflective member 40. An image displayed on the display device 10 may be reflected by the reflective member 40 and provided to a user's right eye through the right lens 10b. Accordingly, the user may view a VR image displayed on the display device 10 through the right eye.

The display device accommodating unit 50 may be disposed at a right end of the support frame 20, but the present disclosure is not limited thereto. For example, the display device accommodating unit 50 may also be disposed at a left end of the support frame 20, and an image displayed on the display device 10 may be reflected by the reflective member 40 and provided to the user's left eye through the left lens 10a. Accordingly, the user may view a VR image displayed on the display device 10 through the left eye. Alternatively, the display device accommodating unit 50 may be disposed at both the right end and the left end of the support frame 20. In this case, the user may view a VR image displayed on the display device 10 through both the left eye and the right eye.

Referring to FIG. 35, a display device 10 according to one or more embodiments may be applied to a smart watch 2 which is one of smart devices.

Referring to FIG. 36, display devices 10_a through 10_c according to one or more embodiments may be applied to a dashboard of a vehicle, a center fascia of the vehicle, or a center information display (CID) disposed on the dashboard of the vehicle. In addition, display devices 10_d and 10_e according to one or more embodiments may be applied to room mirror displays that replace side mirrors of the vehicle.

Figure 37:
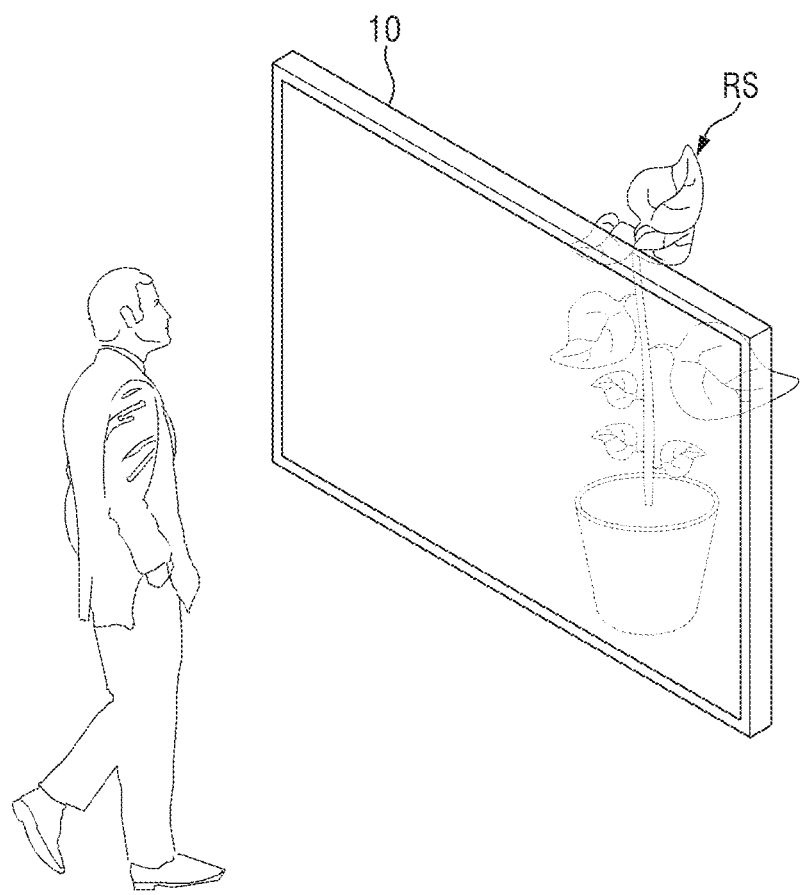
FIGS. 37 and 38 illustrate a transparent display device including a display device according to one or more embodiments.
Figure 38:
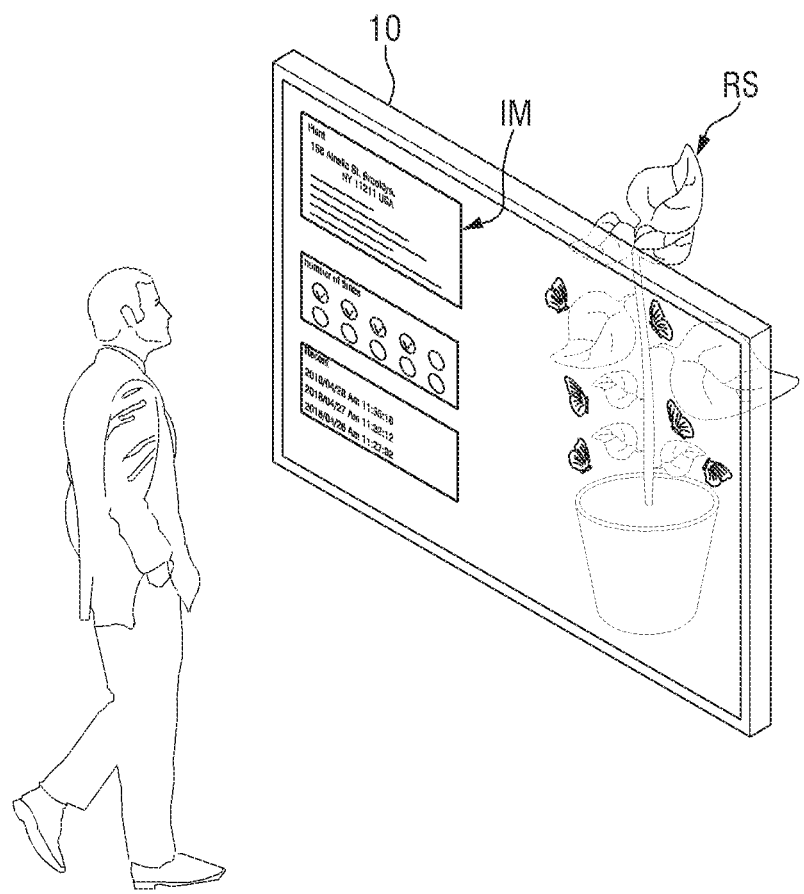

FIGS. 37 and 38 illustrate a transparent display device including a display device 10 according to one or more embodiments.

Referring to FIGS. 37 and 38, the display device 10 according to one or more embodiments may be applied to the transparent display device. The transparent display device may transmit light while displaying an image IM. A user located in front of the transparent display device may not only view the image IM displayed on the display device 10 but also view an object RS or the background located behind the transparent display device. When the display device 10 is applied to the transparent display device, a first substrate 110, a heat dissipation substrate 510, and a circuit board CB of the display device 10 may each include a light transmitting part that can transmit light or may be made of a material that can transmit light.

A display device according to one or more embodiments includes a light exit substrate which includes a plurality of holes disposed to correspond to light emitting elements and a plurality of light exit patterns. Accordingly, upward emission efficiency of light emitted from the light emitting elements can be improved. In addition, because the display device includes the light exit patterns, color mixing of light emitted from adjacent emission areas can be prevented.

In concluding the detailed description, those skilled in the art will appreciate that many variations and modifications can be made to the embodiments without substantially departing from the principles and scope of the present disclosure. Therefore, the embodiments of the present disclosure are used in a generic and descriptive sense only and not for purposes of limitation.

What is claimed is:

1. A display device comprising:
a first substrate comprising a display area, a non-display area, and a plurality of pixel circuit units in the display area and the non-display area;
a light emitting element on the first substrate in the display area, the light emitting element being electrically connected to at least one of the pixel circuit units;
a hole mask layer on the first substrate and comprising a hole that overlaps the light emitting element;
a second substrate on the hole mask layer and comprising an open hole that overlaps the hole; and
a light exit pattern in the open hole of the second substrate,
wherein the light exit pattern comprises a first part in the open hole and a second part protruding from an upper surface of the second substrate, wherein a refractive index of the light exit pattern is different from a refractive index of the second substrate.

2. The display device of claim 1, wherein a maximum diameter of the second part is greater than a diameter of the hole, and
wherein side surfaces of the first part that are in contact with the second substrate are inclined.

3. The display device of claim 2, wherein the second part has a curved outer surface.

4. The display device of claim 2, wherein a refractive index of the second part is different from a refractive index of the first part.

5. The display device of claim 1, wherein the hole and the light exit pattern overlap the light emitting element in a thickness direction of the display device.

6. The display device of claim 1, wherein the light emitting element is configured to emit light of a first color, and
wherein the light exit pattern comprises a colorant to block transmission of the light of the first color.

7. The display device of claim 1, wherein the first part of the light exit pattern comprises wavelength conversion particles to convert a wavelength of light of a first color emitted from the light emitting element, and
wherein the second part of the light exit pattern comprise a colorant to block transmission of the light of the first color.

8. The display device of claim 1, further comprising:
a third substrate between the hole mask layer and the first substrate; and
a color control structure between the third substrate and the light emitting element,
wherein the color control structure overlaps the light emitting element in a thickness direction of the display device.

9. The display device of claim 8, further comprising a color filter between the third substrate and the color control structure,
wherein a width of the color filter is greater than a diameter of the hole.

10. The display device of claim 1, further comprising a capping layer on the second substrate,
wherein a refractive index of the capping layer is smaller than the refractive index of the first part.

11. The display device of claim 10, wherein the refractive index of the capping layer is the same as the refractive index of the second substrate.

12. The display device of claim 11, wherein a thickness of the capping layer is equal to or smaller than a thickness of the second part.

13. The display device of claim 1, wherein the light emitting element comprises a first semiconductor layer, an active layer on the first semiconductor layer, and a second semiconductor layer on the active layer, and
wherein the display device further comprises a third semiconductor layer on the first substrate and on a surface of which the second semiconductor layer of the light emitting element is located.

14. The display device of claim 13, wherein the light emitting element comprises a plurality of light emitting elements,
wherein the second semiconductor layers of the plurality of light emitting elements are connected to each other through a base layer on the surface of the third semiconductor layer in the display area and the non-display area, and
wherein the display device further comprises a plurality of first connection electrodes respectively located between the plurality of light emitting elements and the first substrate in the display area, and
wherein a plurality of second connection electrodes is located between the first substrate and the base layer in the non-display area.

15. The display device of claim 14, wherein the first substrate comprises a plurality of pixel electrodes in the display area and a plurality of common electrodes in the non-display area, and wherein each of the plurality of light emitting elements is on a respective one of the pixel electrodes, and the second connection electrodes are on the common electrodes.

16. A display device comprising:

a first substrate comprising a display area and a non-display area around the display area;

a plurality of light emitting elements spaced from each other in a first direction and a second direction in the display area of the first substrate;

a plurality of common electrodes in the non-display area of the first substrate, and being around the display area;

a hole mask layer on the first substrate and comprising a plurality of holes corresponding to respective ones of the light emitting elements and spaced from each other in the first direction and the second direction;

a second substrate on the hole mask layer and comprising a plurality of open holes formed to correspond to the plurality of holes; and a plurality of light exit patterns in the open holes and are spaced from each other in the first direction and the second direction, wherein the light exit patterns comprise a material, and wherein a refractive index of the material of the light exit patterns is different from a refractive index of the second substrate.

17. The display device of claim 16, wherein a maximum diameter of the light exit patterns is greater than a diameter of the plurality of holes.

18. The display device of claim 17, further comprising:

a plurality of color control structures between the first substrate and the second substrate, the plurality of color control structures overlapping with respective ones of the light emitting elements; and a plurality of color filters overlapping the color control structures, wherein the color filters overlap the plurality of holes.

19. The display device of claim 18, wherein a diameter of the color filters is greater than the diameter of the plurality of holes.

20. The display device of claim 18, further comprising a bank layer around the color filters and extending in the first direction and the second direction.

* * * * *